(12) United States Patent
Whetsel

(10) Patent No.: US 8,441,285 B2
(45) Date of Patent: May 14, 2013

(54) LATCHING CONTROL BUFFER BETWEEN FUNCTIONAL LOGIC AND TRI-STATE OUTPUT BUFFER

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/286,423

(22) Filed: Nov. 1, 2011

(65) Prior Publication Data

US 2012/0043992 A1     Feb. 23, 2012

Related U.S. Application Data

(60) Division of application No. 13/070,020, filed on Mar. 23, 2011, now abandoned, which is a division of application No. 12/940,359, filed on Nov. 5, 2010, now Pat. No. 7,936,183, which is a division of application No. 12/717,565, filed on Mar. 4, 2010, now Pat. No. 7,852,116, which is a division of application No. 12/352,139, filed on Jan. 12, 2009, now Pat. No. 7,701,249, which is a division of application No. 11/460,515, filed on Jul. 27, 2006, now Pat. No. 7,493,536, which is a division of application No. 10/885,926, filed on Jul. 6, 2004, now Pat. No. 7,106,097, which is a division of application No. 10/074,170, filed on Feb. 12, 2002, now Pat. No. 6, 763,487, which is a division of application No. 09/521, 319, filed on Mar. 9, 2000, now Pat. No. 6,378,095, which is a division of application No. 09/259,186, filed on Feb. 26, 1999, now Pat. No. 6,055,659, which is a division of application No. 08/749,586, filed on Nov. 15, 1996, now Pat. No. 5,938,783, which is a continuation of application No. 08/430,651, filed on Apr. 28, 1995, now abandoned.

(51) Int. Cl.
*H03K 19/173* (2006.01)
(52) U.S. Cl.
USPC .............................................. 326/38; 326/82
(58) Field of Classification Search .................... 326/26, 326/27, 37–41, 56–58, 82
See application file for complete search history.

(56) References Cited

U.S. PATENT DOCUMENTS 5,202,625 A * 4/1993 Farwell ......................... 714/727
6,452,417 B1 * 9/2002 Moore ............................ 326/41

* cited by examiner

*Primary Examiner* — Don Le
(74) *Attorney, Agent, or Firm* — Lawrence J. Bassuk; W. James Brady; Frederick J. Telecky, Jr.

(57) ABSTRACT

An electronic integrated circuit includes a signal path connected between the functional logic (15) thereof and an external output terminal. The signal path includes a switch (S), a bus holder circuit (121B), and an output buffer (19).

4 Claims, 19 Drawing Sheets

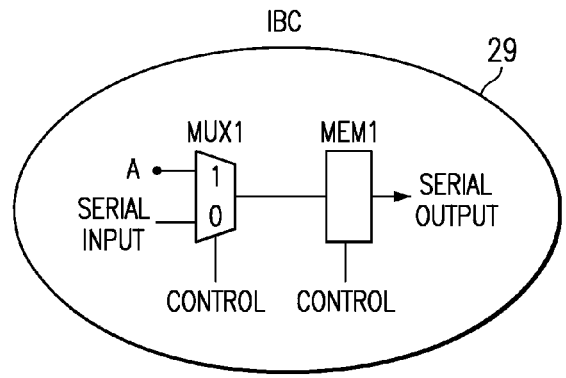
*FIG. 3A*
*(PRIOR ART)*
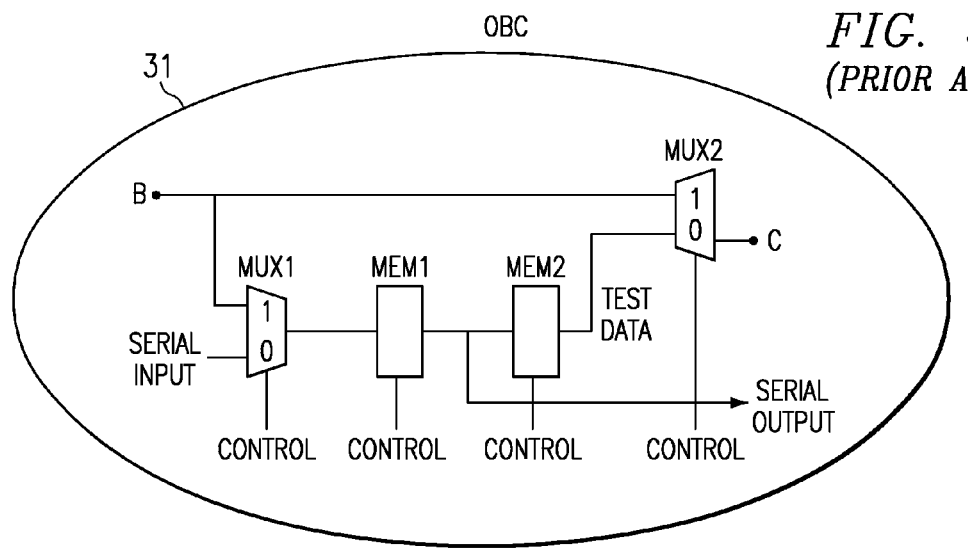
*FIG. 3B*
*(PRIOR ART)*
*FIG. 4*
*(PRIOR ART)*
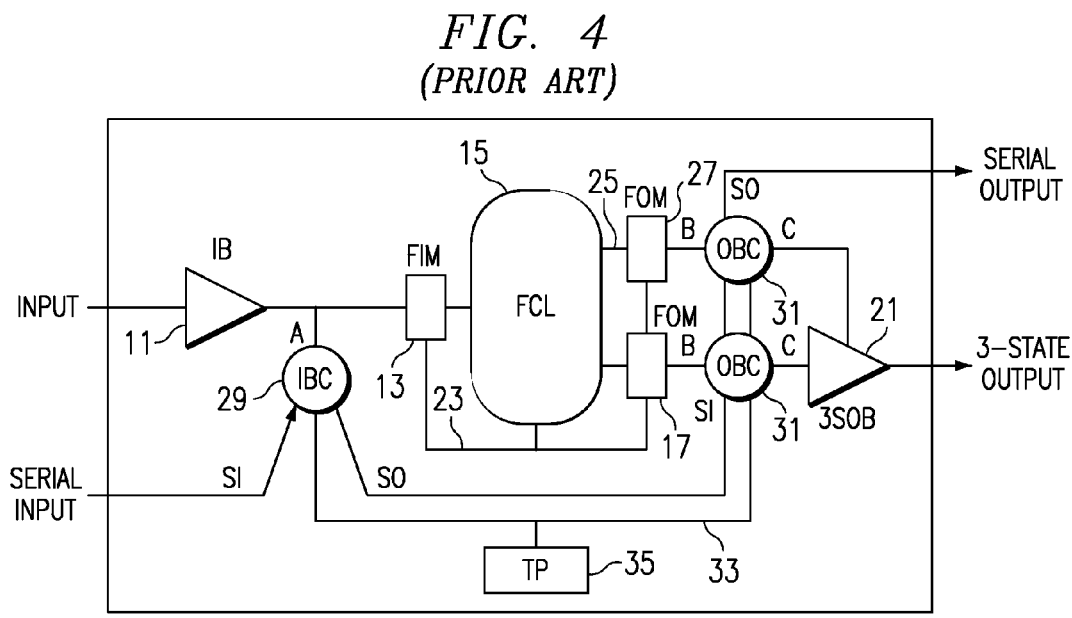

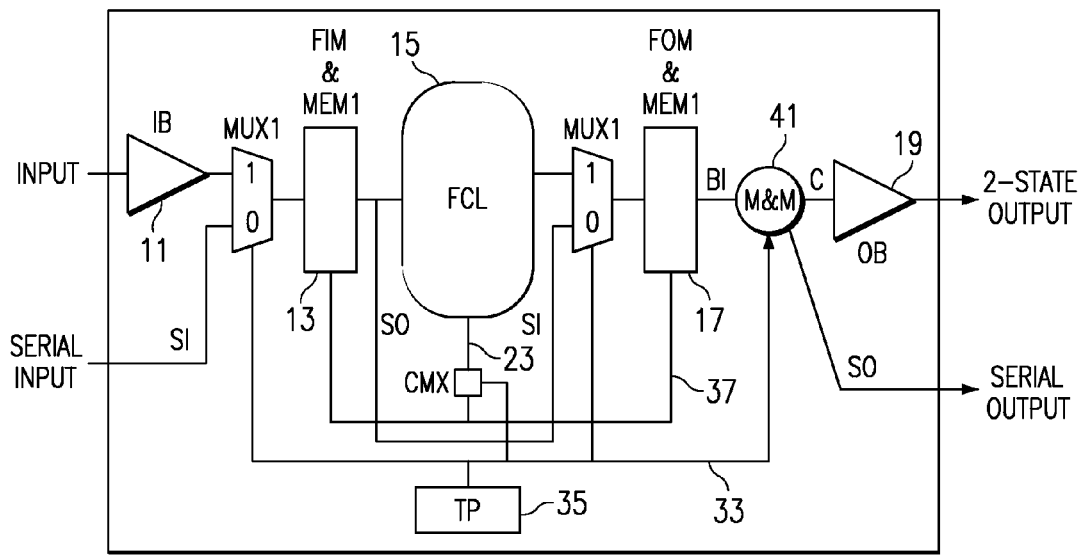
*FIG. 5*
(PRIOR ART)
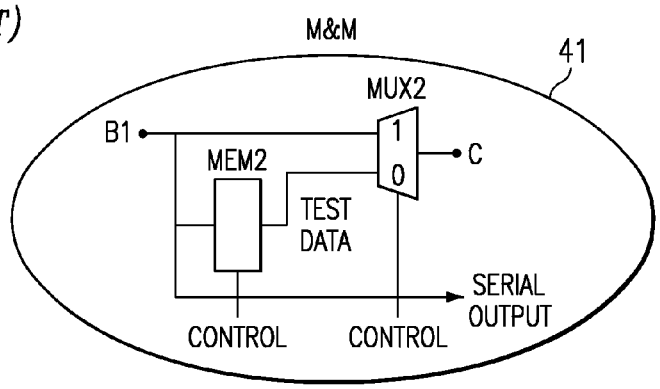
*FIG. 5A*
(PRIOR ART)
*FIG. 5B*
(PRIOR ART)
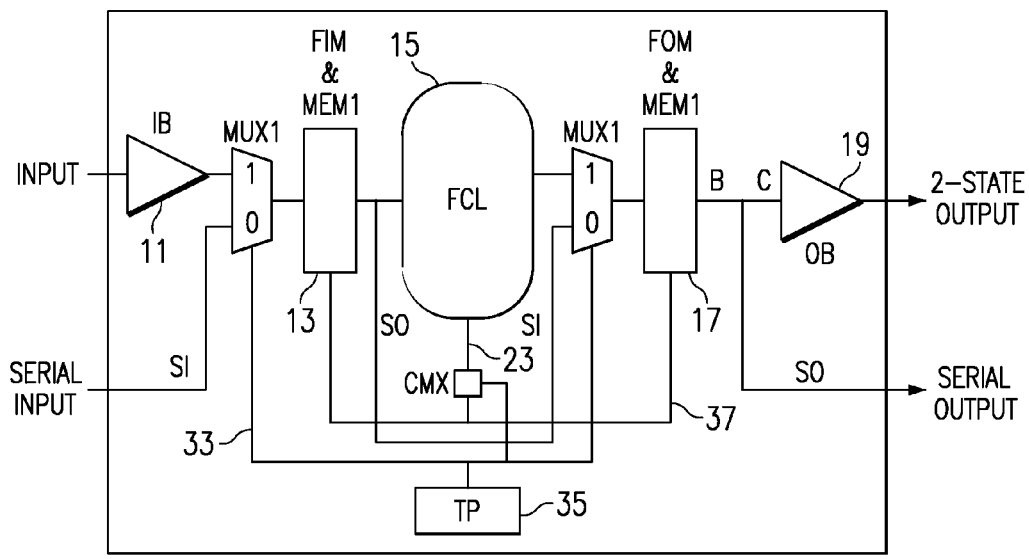

TRANSMISSION GATE
STYLE SWITCH (S)

3-STATE BUFFER
STYLE SWITCH (S)

LATCHING CONTROL BUFFER BETWEEN FUNCTIONAL LOGIC AND TRI-STATE OUTPUT BUFFER

This application is a divisional of application Ser. No. 13/070,020, filed Mar. 23, 2011, now abandoned;

which is a divisional of application Ser. No. 12/940,359, filed Nov. 5, 2010, now U.S. Pat. No. 7,936,183, issued May 3, 2011, which is a Divisional of application Ser. No. 12/717,565, filed Mar. 4, 2010, now U.S. Pat. No. 7,852,116, issued Dec. 14, 2010;

which is a divisional of application Ser. No. 12/352,139, filed Jan. 12, 2009, now U.S. Pat. No. 7,701,249, issued Apr. 20, 2010;

which is a divisional of application Ser. No. 11/460,515, filed Jul. 27, 2006, now U.S. Pat. No. 7,493,536, issued Feb. 17, 2009;

which is a divisional of application Ser. No. 10/885,926, filed Jul. 6, 2004, now U.S. Pat. No. 7,106,097, issued Sep. 12, 2006;

which is a divisional of application Ser. No. 10/074,170, filed Feb. 12, 2002, now U.S. Pat. No. 6,763,487, issued Jul. 13, 2004;

which is a divisional of application Ser. No. 09/521,319, filed Mar. 9, 2000, now U.S. Pat. No. 6,378,095, issued Apr. 23, 2002;

which is a divisional of application Ser. No. 09/259,186, filed Feb. 26, 1999, now U.S. Pat. No. 6,055,659, issued Apr. 25, 2000;

which is a divisional of application Ser. No. 08/749,586, filed Nov. 15, 1996, now U.S. Pat. No. 5,938,783, issued Aug. 17, 1999;

which is a continuation of application Ser. No. 08/430,651, filed Apr. 28, 1995, now abandoned.

TECHNICAL FIELD OF THE INVENTION

The invention relates generally to integrated circuits and, more particularly, to improvements in memory circuitry associated with input, output and bi-directional terminals of integrated circuits.

BACKGROUND OF THE INVENTION

Today boundary scan design in integrated circuits (ICs) is based on an IEEE standard referred to as 1149.1. In 1149.1, flip flops and/or latches, referred to from this point forward as memories, form the boundary scan cells at the IC input, output and bi-directional pins. These boundary scan cell memories are required to be dedicated for test operation. This means that the memories cannot be used functionally by the IC when testing is not being performed. In some ICs, it is technically advantageous to be able to use the memories functionally when the IC is in normal mode, then reuse the memories for test purposes when the IC is placed in a boundary scan test mode. Reuse of memories for function and test purposes is a common practice in internal scan design of ICs. However, 1149.1 boundary scan differs from internal scan in that it requires scan access of the IC's boundary while the IC is in normal mode. Therefore the memories of the boundary scan cells must be available for scanning at all times, forcing them to be dedicated test circuits.

The reason for the aforementioned full time scan access requirement of IEEE STD 1149.1 is two-fold. First, allowing the boundary scan path to be accessed during normal IC operation provides a way to take an on-line sample of the IC's inputs and outputs during normal operation. Second, allowing the boundary scan path to be accessed during normal IC operation provides a way to preload boundary scan memories with test data prior to entering the boundary scan test mode. Of these two requirements, preloading is the most important because it allows initializing the boundary scan cells at IC output pins with safe test data prior to switching the IC into boundary scan test mode.

Sampling has not proven to be a valuable test feature, due to problems of synchronizing the sampling with normal IC operation. Due to the ineffectiveness of sampling, it may become an optional 1149.1 test feature instead of a required test feature. If sampling were made optional, it would be possible to share memories between boundary scan cells and IC functional circuitry. However, if shared memories are used in the absence of the sampling requirement, establishing safe test data in output boundary scan cells to meet the preload requirement would be difficult since sharing of the boundary scan cell memories inhibits scan access during normal IC operation.

Another requirement for 1149.1 boundary scan cells is to control output pins to a predetermined logic condition during scan operations. To achieve this, prior art output boundary scan cells utilized two memories. The first memory is used for capturing and shifting data through the cell, and the second memory is used for holding stable test data at the output pin while the first memory captures and shifts. If the sampling operation, described above, is made optional, the first memory can be shared with functional logic. However, the second memory will be required and dedicated for test to maintain stable data from the output pin while the first shared memory captures and shifts data.

A new boundary scan standard proposal currently in development, referred to as IEEE P 1149.2, is based on allowing first memories (capture/shift memory) of boundary scan cells to be either shared for functional and test purposes or dedicated for test. Also, P1149.2 makes the use of second memories (output hold memory) optional. P1149.2 thus permits an output boundary cell which contains only a shared capture/shift memory. Use of such an output boundary scan cell minimizes test logic, but the IC output pin controlled by such a cell would ripple during capture and shift operations of the shared capture/shift memory. The ripple effect on output pins during capture and shift operations can cause problems during boundary test, such as corruption of the test by rippling test data at the inputs of ICs which do not themselves implement boundary scan, causing them to enter into unknown and potentially dangerous states. For example, if output ripple were to occur from the outputs of a boundary scan IC to the inputs of an non-boundary scan IC, the non-boundary scan IC could respond to the rippling inputs (on say its dock, reset and/or enable pins) to enter into an undesired state. The undesired state could damage the IC or other ICs it is connected to. Furthermore, rippling outputs prevent full control of non-boundary scan ICs during test, and therefore limit what can and cannot be tested.

Since P1149.2 allows sharing of the capture/shift memory, scanning of capture/shift memories to preload test data to optional output hold memories prior to entering boundary scan test mode is not a required feature. In P1149.2, the IC can be simply switched from functional mode into test mode, and P1149.2 assumes that the functional data stored in the shared capture/shift memories of IC output boundary cells at the time of the switch will be safe test data to initially output from the IC. This means that an IC output boundary cell which uses only a shared capture/shift memory will initially output, in test mode, the logic condition previously being output in functional mode. Since the functional outputs from an IC will be unknown at the time of the switch to test mode, unknown test data will be output.

If, for example, a short to ground exists on an output pin when the switch to test mode occurs, and a logic one is stored in the shared capture/shift memory when the switch occurs, the output buffer will attempt to drive a logic one over the ground short. If multiple outputs are shorted to themselves, to ground or to the supply voltage, and shared capture/shift memories attempt to drive out competing voltage levels when switched into test mode, the IC outputs and/or IC itself could be damaged by excessive current flow. A similar problem would exist with P1149.2 output boundary cells that use the optional output hold memory in combination with a shared capture/shift memory, since the output hold memory cannot be preloaded with safe test data. So while P1149.2 may provide a fairly safe way to enter test mode without having to scan (preload) the output cells with test data, the test mode entry method is not safe when IC output pins are subjected to being shorted to ground, supply voltage, or to other pins. Thus, neither 1149.1 or P1149.2 provides a solution to resolving voltage contention problems that can occur at IC outputs when the IC is switched from functional to test mode.

FIGS. 1 and 2 illustrate two exemplary IC functional architectures that will be used to facilitate description of the prior art and the present invention. The IC example in FIG. 1 has an input and a 2-state output and the IC example in FIG. 2 has an input and a 3-state output. During functional operation of the ICs, input data passes through an input buffer (IB) 11 and is stored in a functional input memory (FIM) 13, for example, a latch. The output of the FIM is input to the IC's functional core logic (FCL) 15. The functional core logic outputs data to be stored in a functional output memory (FOM) 17, for example, a latch, and output from the IC via an output buffer (OB) 19 in FIG. 1 or via a 3-state output buffer (3SOB) 21 in FIG. 2. Data is stored in the FIM and FOM(s) by control output 23 from the functional core logic. The only difference between the two ICs is that the FCL of FIG. 2 outputs control 25 to a FOM 27 to enable or disable the IC's 3-state output buffer. Use of FIMs and FOMs at IC inputs and outputs is beneficial in high speed IC architectures, due to the synchronizing or pipelining effect they provide for rapid IC data input and output movement. Also FIMs and FOMs can be positioned physically dose to the input and output buffers, respectively, reducing input and output time delays. Because the FIM 13 is interposed between the IB 11 and the FCL 15, the IB does not directly drive the FCL. The FIM does not have the same drive capability as IB, so it is often necessary to provide between FIM and FCL a high-drive buffer (not shown) capable of providing the input drive required by FCL.

FIG. 11 is similar to FIGS. 1-2 and shows an IC which uses functional input and output memories (FIMs & FOMs) to store data and control flowing between the functional core logic (FCL) and input (I), output (O), and input/output (I/O) pins. The FIMs receive data from the input buffers and update control (UC) from the FCL to store the data. The FIMs output the stored data to the FCL. The FOMs receive data or control from the FCL and UC from the FCL to store the data or control. The FOMs output stored data or control to the output buffers. A single FOM outputs data to 2-state output buffers (2SOB) and two FOMs output data and control to 3-state output buffers (3SOB). While individual input, output, and I/O pins are shown, it should be understood that multiple input, output, and I/O pins could be used on the IC to form a bussed arrangement of input, output, and I/O pins.

It is important to note the following in FIGS. 1-2 and 11; (1) each FIM and FOM is a complete memory element requiring circuitry for receiving data, circuitry for storing data in response to UC, and circuitry for outputting stored data, (2) each FIM and FOM introduces a delay in the data path due to its required circuitry, (3) each FOM continuously drives the output buffer and the output pin with the data stored, even if the output pin is shorted to an opposing voltage data level, such as ground or supply.

FIGS. 3 and 4 illustrate the IC architectures of FIGS. 1 and 2 when test logic for 1149.1 boundary scan is implemented therein. On IC inputs, an input boundary cell (IBC) 29 is connected to the output of the input buffer (at "A"). On 2-state IC outputs (FIG. 3), an output boundary cell (OBC) 31 is inserted in series with the data path between the FOM 17 and the 2-state output buffer (at "B" & "C"). On 3-state IC outputs (FIG. 4), an OBC 31 is inserted in series with the data path between the FOM 17 and 3-state output buffer (3SOB), and another OBC 31 is inserted in series with the control path between the FOM 27 and 3-state output buffer enable input. Examples of the IBC and OBC test logic are respectively shown in FIGS. 3A and 3B. The IBC and OBC(s) are connected serially from a serial input pin of the IC to a serial output pin of the IC to allow data to be shifted through the cells. The cells receive control via control bus 33 from a test port (TP) 35 to control their operation. It is important to note with respect to FIG. 4 that a single control path OBC can control a group of data path OBCs that form a functional 3-state bus, i.e. 1149.1 does not require that each 3-state output pin of a bus have its own control cell.

The IBC 29 of FIG. 3A contains an input multiplexer (Mux1) and a capture/shift memory (Mem1). Mux1 is controlled by the TP to input either serial data input (SI) or system data input (A) to Mem1. Mem1 loads data in response to TP control. The output of Mem1 is output as serial output (SO) data. The OBC 31 of FIG. 3B contains an input multiplexer (Mux1), a capture/shift memory (Mem1), an output hold memory (Mem2), and an output multiplexer (Mux2). Mux1 is controlled by the TP to input either serial data input (SI) or system data input (B) to Mem1. Mem1 loads data in response to TP control. The output of Mem1 is input to Mem2 and also output as serial output (SO) data. Mem2 loads data from Mem1 in response to TP control. Mux2 is controlled by the TP to output either data from Mem2 or system data (B) to the output buffer (C). The 1149.1 standard requires that the logic of IBCs and OBCs be dedicated for testing and not reused functionally by the IC.

The OBC differs from the IBC because 1149.1 boundary scan requires that the IC outputs be able to be controlled to a predetermined output logic condition, while data is captured into and shifted through the OBC. The reason for this requirement is to prevent connected IC inputs from receiving the data ripple effect that would occur from IC outputs during the capture and shift operations. This requirement forces the OBC to have two memories, a first memory (Mem1) for capturing and shifting data, and a second memory (Mem2) for maintaining the IC output pin at a desired logic condition (logic one, zero or tristate) while data is captured and shifted by the first memory. It is important to note that the OBC's Mux2 introduces a delay in both the data and control paths between the FOMs and 2-state/3-state output buffers, which can adversely impact IC performance.

The 1149.1 standard requires two types of test operations for boundary scan cells, a sample and preload operation (Sample/Preload) and an external test operation (Extest). The sample part of Sample/Preload allows the Mux1 and Mem1 of IBC and OBC to be controlled by the TP to capture and shift out system data while the IC is in normal operation. The preload part of Sample/Preload allows the TP to shift data into Mem1 of OBCs and update the data into Mem2 of OBCs, while the IC is in normal operation. The ability to preload Mem2 of OBCs before the IC is placed in Extest is important because it allows establishing what test data will be output from the IC when the IC enters Extest mode, i.e. when Mux2 of OBCs is switched from outputting system data (B) to outputting data from Mem2. Without the ability to preload Mem2, potentially damaging test data could be output from the IC when it is switched from normal to Extest operation.

When the IC is placed in Extest, Mux2 of OBC is controlled by the TP to output test data stored in Mem2 to the output buffer. In FIG. 3, the test data output from OB 19 when Extest is entered is either a logic one or zero. In FIG. 4, the test data output from 3SOB 21 when Extest is entered is either logic one, logic zero, or tristate. During Extest, OBCs are operated by the TP to shift in and update test data to IC outputs to tristate the output or drive logic levels onto wiring interconnects, and IBCs are operated by the TP to capture and shift out test data arriving at IC inputs from wiring interconnects. In this way, Extest is used to test wiring interconnects between IC inputs and outputs on, for example, a printed wiring board. The operation of both these 1149.1 test operations is well known by workers in boundary scan testing.

The usefulness of the sample part of the Sample/Preload operation is limited because it is difficult to synchronize the capture operation of the IBC's and OBC's Mem1 with the functional data arriving at and departing from the IC's inputs and outputs, respectively. This is because the IBC and OBC(s) are controlled by timing from the TP, and the FIM and FOM(s) are controlled by the timing from the functional core logic. As a result, the sample part of the Sample/Preload operation may become an optional boundary scan test feature in 1149.1, whereas now it is a required test feature. If the sample part of Sample/Preload is made optional, then the FIM and FOM(s) of the ICs in FIGS. 3 and 4 could serve as the Mem1 of the IBC and OBC(s), respectively, when the IC is placed in Extest mode.

FIGS. 5 and 6 illustrate boundary scan designs where the sample feature is omitted, enabling the FIM and FOM(s) to serve as functional memories during normal IC operation and boundary cell capture/shift memories (Mem1) during test operation. This reduces the boundary scan test logic overhead at input pins by one memory, overhead at 2-state output pins (FIG. 5) by one memory, and overhead at 3-state output pins (FIG. 6) by two memories. To use the FIM and FOM as functional and test memories, the control 37 to each must be switchable to allow the FIM and FOM to operate in response to control 23 from the functional core logic during normal operation, and in response to control from TP during test operation. To achieve this, a control multiplexing (CMX) circuit is shown in FIGS. 5 and 6 to allow switching of control between test and normal operations. The CMX circuit allows control from the functional core logic or control from the TP to be globally distributed to each FIM and FOM. Control to switch the CMX comes from the TP.

In FIGS. 5 and 6, it is seen that, when using shared FIMs, the IBC function is implemented with only Mux1 required as dedicated test circuitry. In FIGS. 5 and 6, it is seen that, when using shared FOMs, the OBC function is implemented with only Mux1, Mem2 and Mux2 as dedicated test circuitry. The Mem2 and Mux2 (M&M) circuitry 41 is shown in FIG. 5A. It is important to note that Mem2 and Mux2 (M&M) must still be inserted between the shared FOM and output buffer (at "B1" and "C"). Also it is important to note that the Mux2 delay on the data and control paths is maintained in the boundary scan designs of FIGS. 5 and 6, which adversely impacts IC performance.

Although it is possible to share a functional memory with the Mem2 function, to do this would require at least one additional multiplexer and additional wire routing to enable a memory inside the FCL to be coupled to Mux2 and the shared FOM (17 or 27).

A problem with the boundary scan designs of FIGS. 5 and 6 is that there is no way to preload Mem2 by scanning data into Mem1 as previously described for the boundary scan designs of FIGS. 3 and 4. This is because the shared FOM (Mem1) is used functionally by the IC and therefore cannot be scanned by the TP to input safe test data to upload into Mem2. Thus when the IC is initially placed into Extest, Mux2 is switched to output unknown test data from Mem2 to the 2-state output buffer of FIG. 5 and 3-state output buffer of FIG. 6. This unknown test data may cause the output buffers to output conditions that might damage other circuits or output buffers when Extest is entered. So while the shared boundary scan design of FIGS. 5 and 6 does reduce the test logic overhead at IC input and output pins, it is not able to initially enter Extest with safe test conditions being output from the IC. After Extest is entered, and following the first scan operation to the IBC and OBC(s), the Mem2 at output pins is uploaded with safe test data from the shared Mem1 memory. However, the period of time between the initial entry into Extest and the updating of safe test data into Mem2 provides an opportunity for circuitry and/or buffer damage.

The boundary scan cells of FIGS. 5 and 6 are similar to those proposed in the P1149.2 boundary scan standard, in that Mem1 is shared with a functional memory (FOM). In P1149.2, the M&M circuitry in the data path of FIGS. 5 and 6 between the shared Mem1 17 and 2-state or 3-state output buffer can be optionally deleted, allowing the output of the shared Mem1 17 to be directly input to the 2-state or 3-state output buffer, as shown in FIGS. 5B and 6A. However, P1149.2, like 1149.1, requires that the M&M circuitry be placed in series between the output of the shared Mem1 27 and the 3-state control input of the 3-state output buffer 3SOB. The requirement to place the M&M circuitry in the control path allows the 3-state output to be controlled to either a 3-state or enabled condition while data is captured and shifted through the shared Mem1 27 of the control path. However, with the M&M circuitry optionally deleted from the data paths of 2-state and 3-state outputs, the data from these pins, assuming the 3-state output is enabled (which it must be to permit updating test data to the output pin during Extest), will ripple as data is captured and shifted through the shared Mem1s 17 of the data path. As mentioned previously, the rippling of data outputs during capture and shift operations can cause damage to ICs and/or limit what can and cannot be tested.

With the growing interest in sharing memories between functional and boundary scan circuits, and with the above-described problems associated with shared memories, a need has arisen for improved OBCs for 2-state and 3-state output buffers. The present invention provides a boundary scan cell including a shared capture/shift memory, and an output buffer structure which provides the ability to; (1) establish safe test data at IC outputs when the IC is switched from functional mode to boundary test mode without first having to scan safe test data in, (2) quickly resolve voltage contention problems at IC output pins due to shorts between pins, ground or supply voltage, and (3) maintain stable test data at output pins while data is captured and shifted through shared capture/shift memories, without having to use an output hold memory.

The boundary scan cell of the present invention requires very low overhead when used on 2-state and 3-state type IC output pins.

It is also desirable to: reduce circuitry overhead associated with conventional FIM and FOM structures; eliminate the need for high-drive buffers between FIMs and FCL; provide a FOM structure capable of resolving voltage contention at the output pin; reduce signal path delays associated with conventional FIM and FOM structures; and reduce signal path delays associated with conventional combinations of FIM/FOM structures and boundary scan cells. To this end, the present invention realizes the FIM function by combining the input buffer with a feedback circuit and a switch, and realizes the FOM function by combining the output buffer with a feedback circuit and a switch. The invention also realizes the FIM and FOM functions using switches and bus holder circuits. The invention also combines boundary scan structures with the aforementioned FIM and FOM functions to provide boundary scan operation without speed penalty to functional operation.

BRIEF DESCRIPTION OF THE DRAWINGS

FIGS. 3-6 illustrate prior art boundary scan designs.

DETAILED DESCRIPTION OF THE INVENTION

Figure 7:
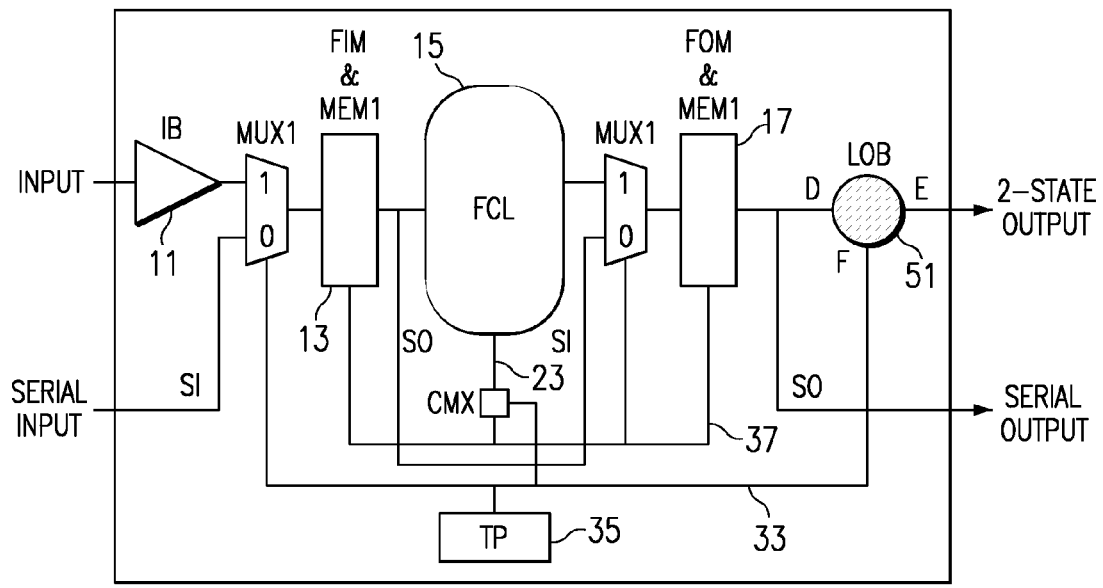
FIG. 7 illustrates an exemplary boundary scan design according to the present invention, for use with a 2-state output.

In FIG. 7, an IC is shown sharing FIMs and FOMs with IBC and OBC Mem1's as described in FIG. 5. The IBC implementations of FIGS. 5 and 7 are the same. In the OBC implementation of FIG. 7, the Mem1 function is shared with the FOM 17, the Mux1 function remains as required test logic, and the Mem2 and Mux2 functions (M&M) are eliminated. The elimination of Mux2 and Mem2 is made possible by a novel latchable output buffer (LOB) design shown at 51 in FIG. 7. The LOB is connected to the output of the shared FOM (at D), the output pin (at E), and TP (at F) of FIG. 7.

Figure 1:
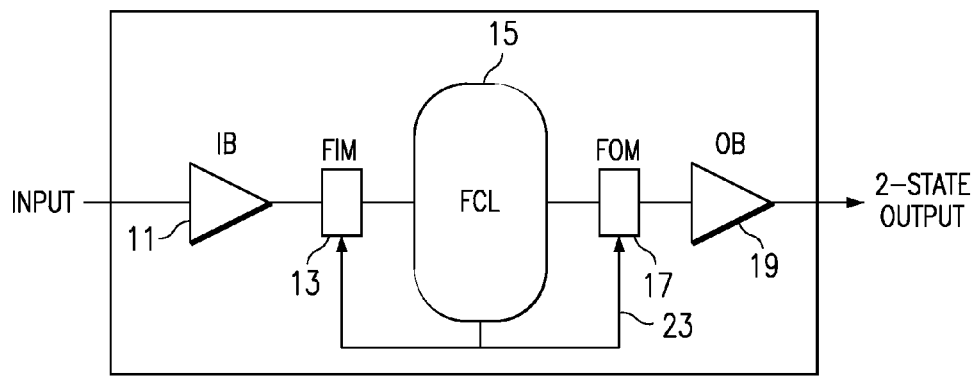
FIGS. 1 and 2 illustrate exemplary IC functional architectures to which the present invention is applicable.
Figure 7A:
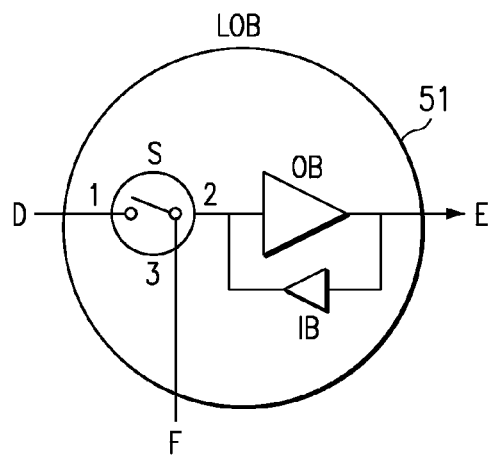

A circuit example of the LOB 51 is shown in FIG. 7A. The LOB includes a switch (S), an output buffer (OB), and an input buffer (IB). The switch has an input terminal (1) for connection to the IC functional circuitry (at D), an output terminal (2) for connection to the input of the OB, and a control terminal (3) for connection to the TP (at F). The OB has an input connected to the output terminal (2) and an output connected to the IC pin (at E). The IB has an input connected to the output of the OB (at E) and an output connected to the input of the OB. During normal IC operation, the switch S is closed by control input at 3 from TP and functional data from the FOM 17 is output from the IC pin via the OB. The IB of LOB 51 is a weak buffer so that, while the switch S is closed, the output from IB is overdriven by the data from the FOM, making the IB transparent to the operation of the LOB during normal IC operation So during normal operation the 2-state output of FIG. 7 operates as the 2-state output of the IC in FIG. 1.

Figure 7B:
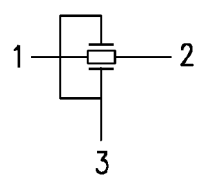
Figure 7C:
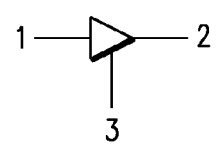

During Extest, the switch S is operated by TP to open and close as required during testing. When the switch is opened, the IB provides feedback to the input of the OB to latch the test data currently being output from OB. When the switch is closed, test data from the FOM overdrives the IB and is output from the OB. Some switch circuit examples that could be used as switch S in the LOB are shown in FIGS. 7B and 7C, i.e. the transmission gate and 3-state buffer.

Figure 6:
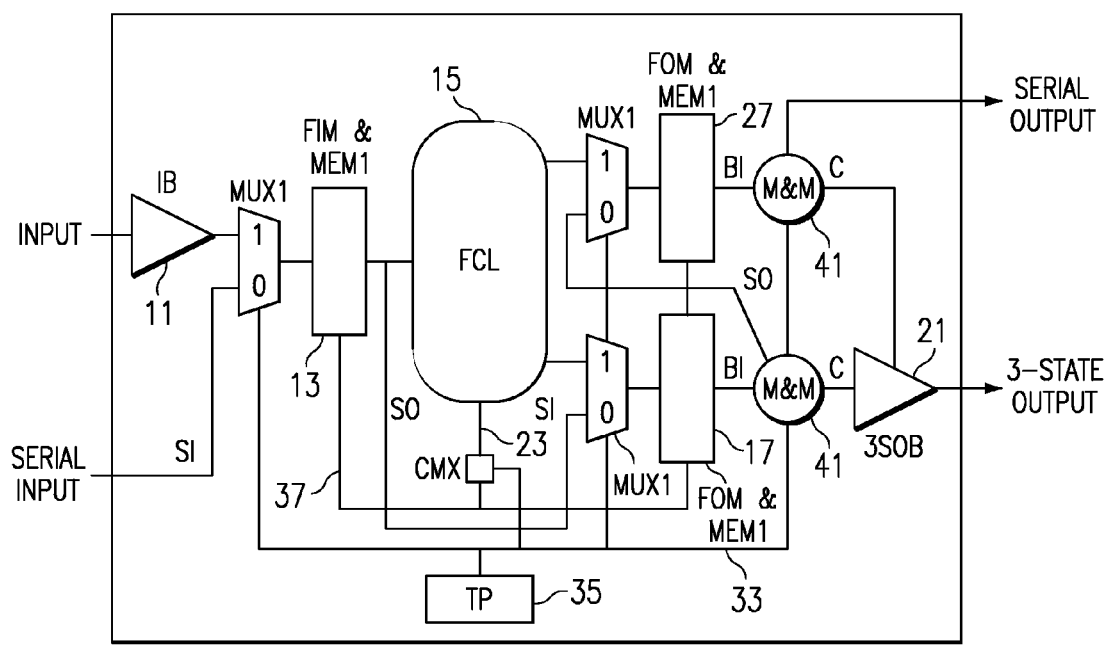
Figure 6A:
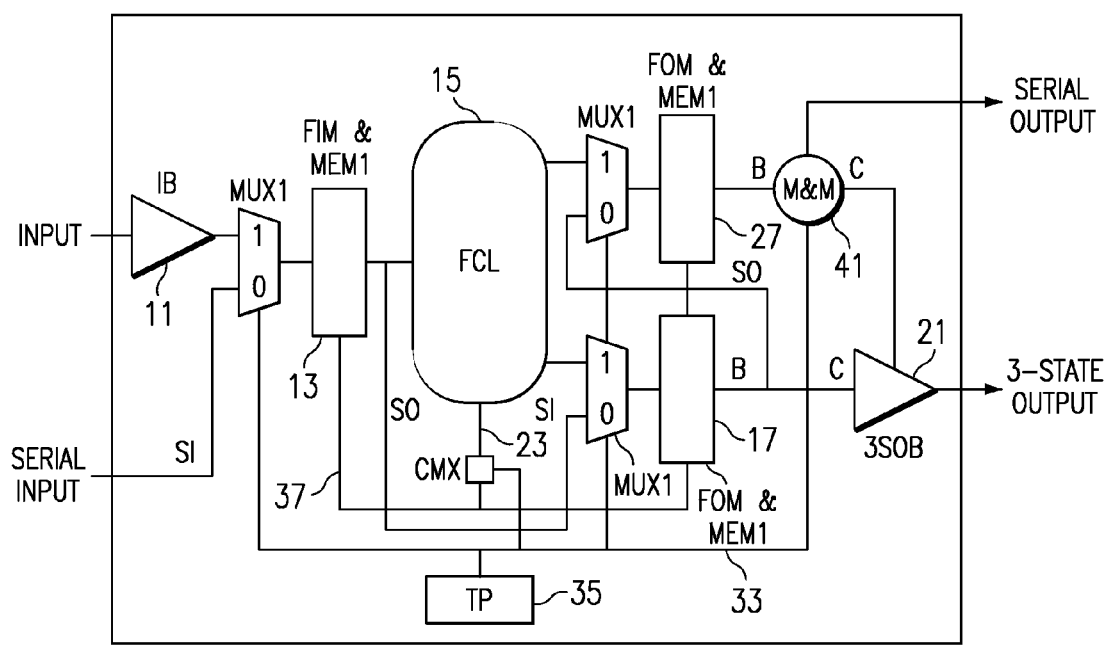
Figure 8:
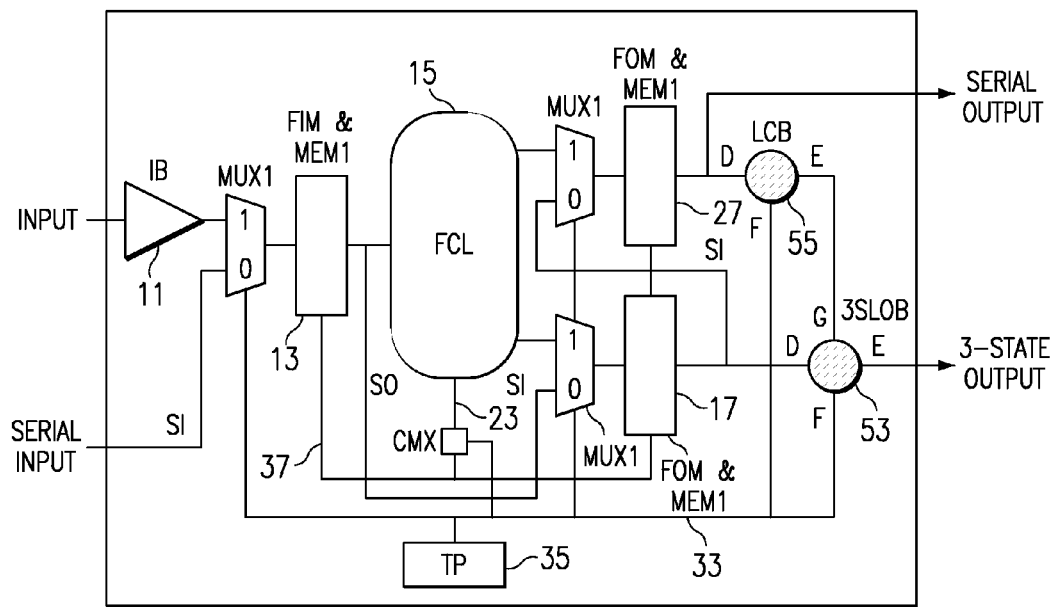
FIG. 8 illustrates an exemplary boundary scan design according to the present invention, for use with a 3-state output.

In FIG. 8, an IC is shown sharing FIMs and FOMs with IBC and OBC Mem1's as described in FIG. 6. The IBC implementations of FIGS. 6 and 8 are the same. In the OBC implementations of FIG. 8, the Mem1 functions are shared with the FOMs 17 and 27, the Mux1 functions remain as required test logic, and the Mem2 and Mux2 functions (M&M) are eliminated. The elimination of Mux2 and Mem2 in the data path is made possible by a novel 3-state latchable output buffer (3SLOB) design shown at 53 in FIG. 8. The elimination of Mux2 and Mem2 in the control path is made possible by a novel latchable control buffer (LCB) design shown at 55 in FIG. 8. The 3SLOB is connected to the output of the shared data path FOM 17 (at D), the output pin (at E), TP (at F), and a control output of the LCB (at G). The LCB is connected to the output of the shared control path FOM 27 (at D), the control input G of the 3SLOB (at E), and TP (at F).

Figure 8A:
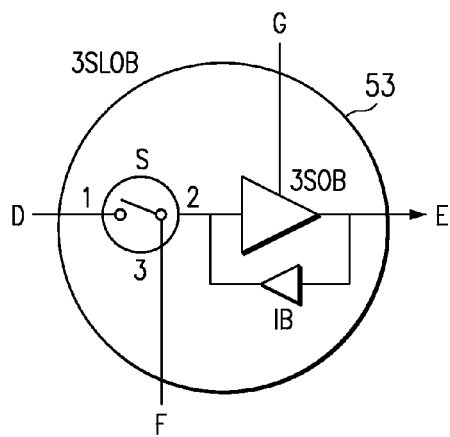

A circuit example of the 3SLOB 53 is shown in FIG. 8A. The 3SLOB includes a switch (S), a 3-state output buffer (3SOB), and an input buffer (IB). The structure and operation of the 3SLOB is similar to the previously described LOB of FIG. 7. The difference between the LOB and 3SLOB is that the 3SLOB contains a 3SOB and a control input (G) to enable or disable the drive of the 3SOB.

Figure 8B:
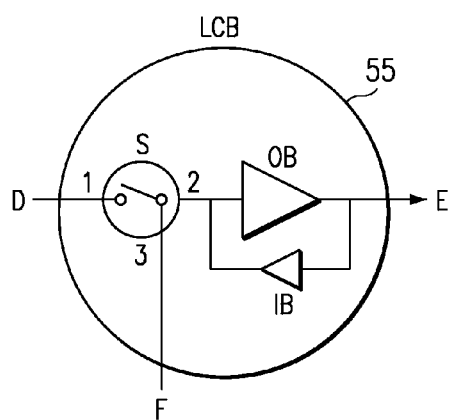

A circuit example of the LCB 55 is shown in FIG. 8B. The LCB includes a switch (S), an output buffer (OB), and an input buffer (IB). The structure and operation of the LCB is similar to the previously described LOB of FIG. 7. The difference between the LOB and LCB is that the LCB uses smaller functional buffers for OB and IB, whereas the LOB uses larger buffers to drive the IC output pins. For example, the IB function of the LCB could be realized by a simple pass transistor or transmission gate instead of an actual buffer.

Figure 2:
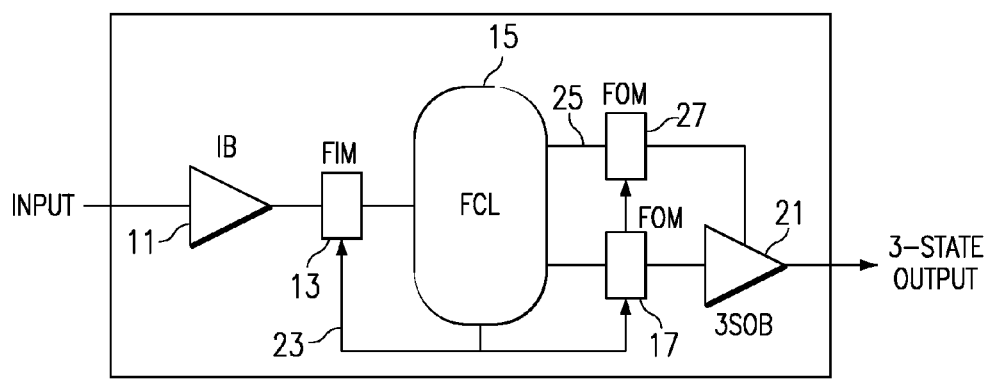

During normal IC operation in FIG. 8, the switches of the 3SLOB and LCB are closed by control input from TP, and functional data and control from the FOMs define the state of the IC's 3-state output pin. While the switches of 3SLOB and LCB are closed, the outputs from the IBs of 3SLOB and LCB are designed to be overdriven by the data from FOM 17 and control from FOM 27, respectively, making the IBs transparent to the operation of the 3SLOB and LCB during normal IC operation. So during normal operation the 3-state output of FIG. 8 operates as the 3-state output of FIG. 2.

During Extest, the switches of LCB and 3SLOB are operated by TP to open and dose as required during testing. When the switch of the LCB is opened, the IB provides feedback to the input of the OB to latch the test data (3-state control) currently being output from the OB to the 3SLOB. When the switch of the LCB is dosed, test data from the control FOM 27 overdrives the IB and is output from the OB to the 3SLOB. When the switch of the 3SLOB is opened, the IB provides feedback to the input of the 3SOB to latch the test data currently being output from the 3SOB to the 3-state output pin. When the switch of the 3SLOB is closed, test data from the data FOM 17 overdrives the IB and is output from the 3SOB to the 3-state output pin.

Note that if the control input to the 3SLOB from the LCB disables the 3SLOB's 3SOB, the 3-state output pin drive will be disabled. When the 3-state output pin is disabled, the IB of the 3SLOB will input to the 3SOB, but the 3SOB cannot drive out what is being input. For example, if the 3-state output pin of FIGS. 8-8A is disabled, and a connected 3-state output pin is enabled, then the IB of FIG. 8A will input to 3SOB the data driven from the enabled pin but the 3SOB of FIG. 8A cannot output the data.

The LOB, LCB and 3SLOB of FIGS. 7A, 8B and 8A could be implemented with an IB that is enabled to drive the OB/3SOB input when the switch is opened by TP input (at F), and disabled from driving the OB/3SOB input when the switch is closed by TP input (at F). However, regardless of the implementation style, the function of the IB is to provide feedback to the OB/3SOB to maintain a logic state at the output pin when the switch is opened. It is also important to note that the LOB, LCB and 3SOB eliminate the Mux2 delay and signal loading by Mux2 and Mem2 seen in the OBCs of FIGS. 5 and 6, which results in improved IC performance.

One problem mentioned previously with the prior art boundary scan designs of FIGS. 5 and 6 was that sharing functional memories for Mem1 prevents scanning Mem1 to preload Mem2 with safe test data prior to entering Extest. Note that the output boundary cells of the boundary scan designs in FIGS. 7 and 8 don't have a Mem2 or Mux2. The Mem2 and Mux2 cell functions are realized by the LOB of FIG. 7 and by the 3SLOB and LCB of FIG. 8 the instant the IC switches from normal operation to Extest mode. During normal operation, LOB, 3SLOB and LCB are driven by the IC's functional core logic to output functional data. The functional data output during normal mode is safe to output when the IC is switched into Extest mode. Therefore the LOB, 3SLOB and LCB of FIGS. 7 and 8 all latch and hold their last functional data value when they receive control from TP to switch from functional operation into Extest.

To place the IC in Extest, TP outputs control to open the switch of LOB (FIG. 7), or the switches of 3SLOB and LCB (FIG. 8). When the switch opens, the input drive from the associated FOM is disabled and the present functional state of the output pin is maintained by the feedback provided by the IB. For example, in FIG. 7, if the LOB was outputting a logic level to the 2-state output pin in functional mode when TP opens the LOB's switch to enter Extest, the logic level being output from the LOB's OB is fed back to the input of the OB and latched, via the B. Thus the LOB provides a way to latch the last functional logic level state being driven out of a 2-state output when Extest is entered. In FIG. 8, if the 3SLOB and LOB were outputting data and control for the 3-state output in functional mode when TP opens their switches to enter Extest, the data and control being output respectively from the 3SLOB's 3SOB and the LCB's OB are fed back to the inputs of the 3SOB and OB, respectively, and latched, via the IBs. Thus the 3SLOB and LCB provide a way to latch the last functional logic condition being driven out of a 3-state output when Extest is entered.

The above-described feature of maintaining the last functional output state when an IC transitions from functional mode to Extest mode provides a safer method of Extest entry than that offered by the OBCs of FIGS. 5 and 6. Furthermore, if during entry into Extest an output buffer was placed in contention with another output buffer, or shorted to ground or supply voltages, the voltage contention would be quickly resolved by the feedback mechanism built into the LOB and 3SLOB. For example, if a short to ground existed on an output pin and the functional logic of the IC was attempting to output a logic one through an LOB when Extest was entered, the LOB's switch would open and the feedback provided by IB would cause OB to output a logic zero, ending the voltage contention at the 2-state output pin.

Figure 3:
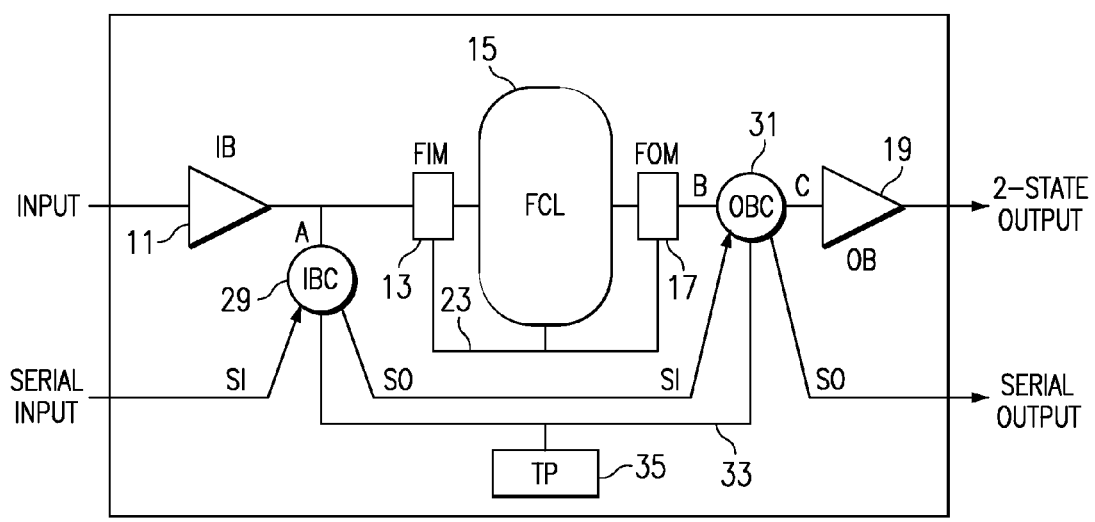

After Extest is entered and safe outputs have been established at IC outputs, the TP can scan Mem1 to perform the 1149.1 capture, shift and update operations as described in FIGS. 3 and 4. Note that the 3SLOB, LCB and LOB, in addition to establishing safe test output conditions upon Extest entry, also provide the Mem2 function of maintaining stable test data to output pins while Mem1 captures and shifts data during Extest. This is accomplished by TP opening the switches of the 3SLOB, LCB and LOB during capture and shift operations. The switches of 3SLOB, LCB and LOB are then momentarily closed at the end of the capture and shift operations to permit new test data to be updated from Mem1 to the IC output via 3SOB and OB of 3SLOB and LOB. Although it is preferred to close the switches only momentarily at the end of the capture/shift operations, the switches can, if desired, remain closed until immediately before the next capture/shift operation, but the above-described resolution of voltage contention will not occur unless the switch is open.

Figure 9:
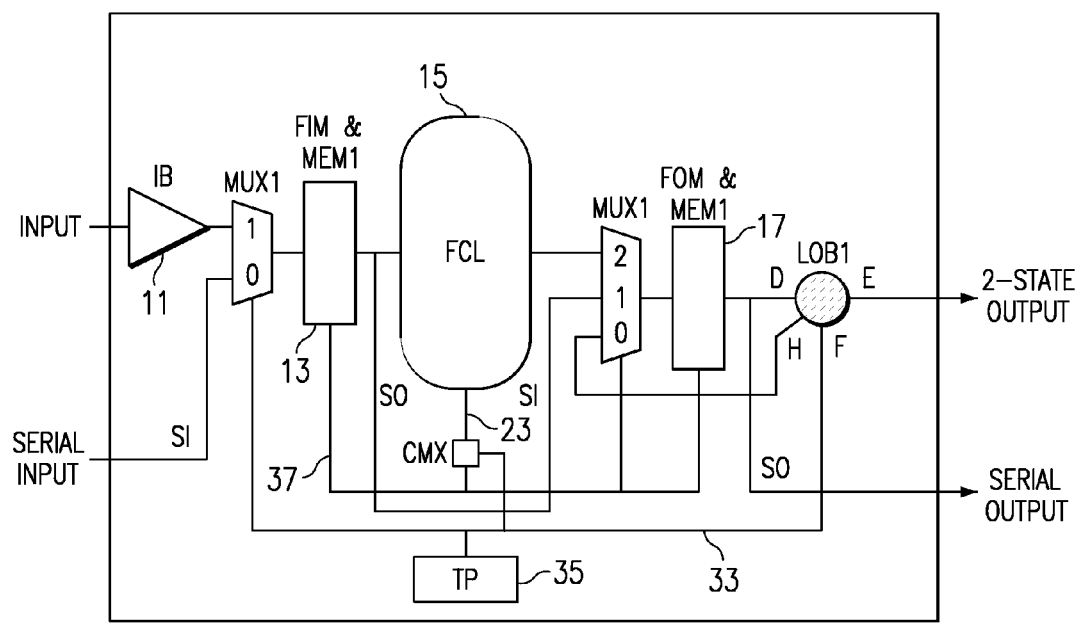
FIG. 9 illustrates another exemplary boundary scan design according to the present invention, for use with a 2-state output.
Figure 9A:
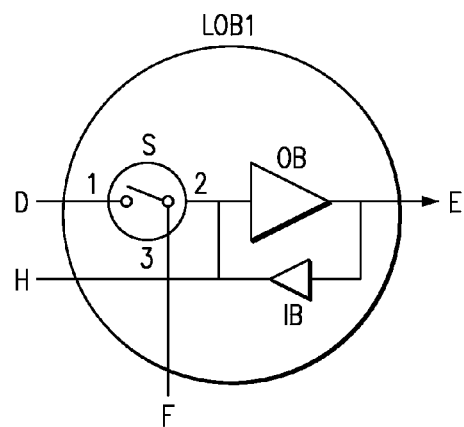
Figure 10:
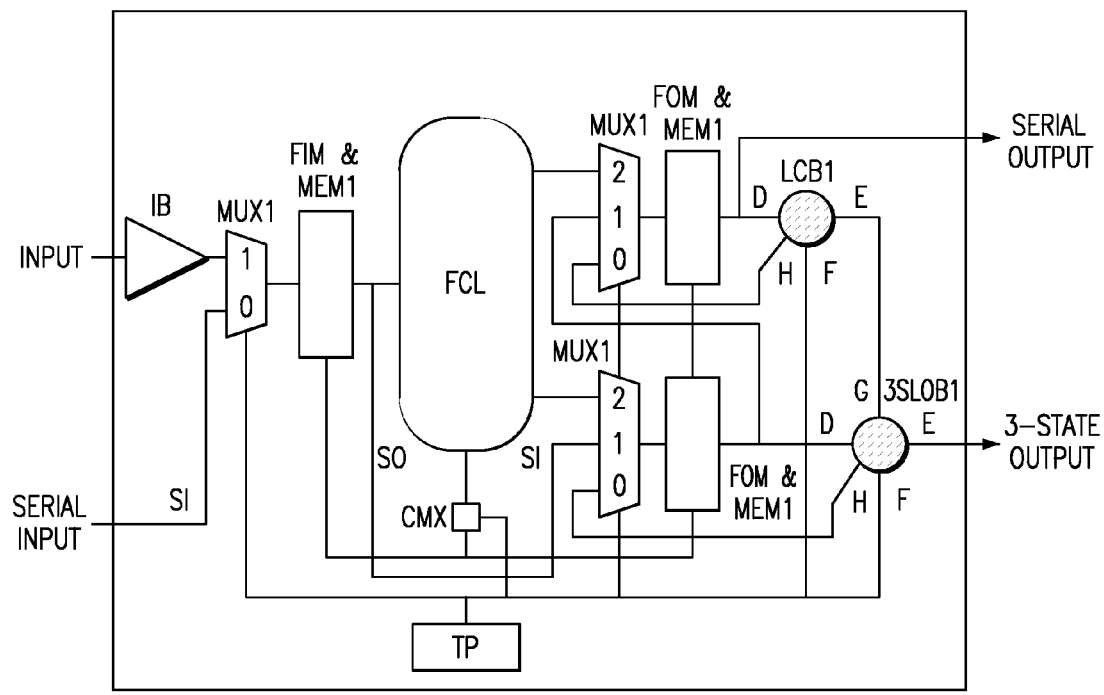
FIG. 10 illustrates another exemplary boundary scan design according to the present invention, for use with a 3-state output.
Figure 10A:
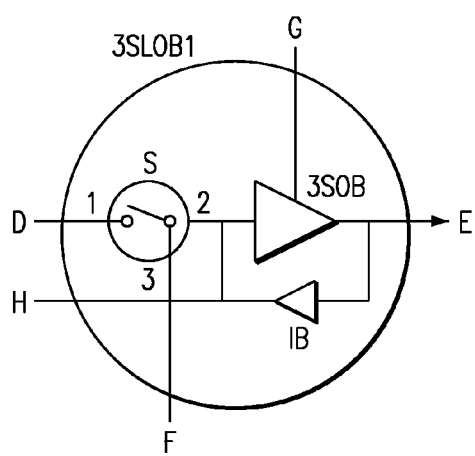
Figure 10B:
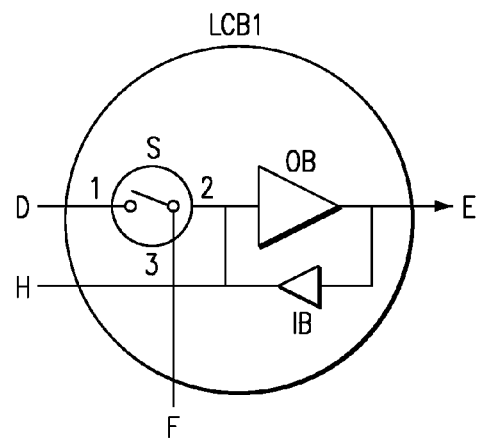

In FIGS. 9 and 10, LOB1, 3SLOB1 and LCB1 are similar to the above-described LOB, 3SLOB and LCB, but are designed to allow Mem1 to capture the test data output from each by adding a signal output (H) from the IBs. The signal output H is shown in the LOB1, 3SLOB1 and LCB1 of FIGS. 9A, 10A and 10B, respectively. The signal output (H) is connected to an additional input to Mux1 of each associated Mem1. This allows Mem1 to selectively capture either system data from the functional core logic (using the pre-existing mux input) or the test data output H from the LOB1, 3SLOB1 and LCB1 (using the added mux input). The selectivity control to determine what is captured comes from TP. The ability to capture the output of the LOB1, 3SLOB1 and LCB1 allows testing to see if a 2-state or 3-state pin output is actually driving out the logic level expected. For example, if the LOB1 in FIG. 9 is updated with a logic one and the 2-state output pin is shorted to ground, the feedback in LOB1 will cause the output to go to and latch at a logic zero when switch S opens. During the next capture and shift operation (assuming Mux1 is set to load signal H from the LOB1 into Mem1), the logic zero condition of the 2-state output will be seen to be different from the expected logic one that was previously updated, making the short to ground condition on the 2-state pin detectable. A similar output condition detection test is possible on 3-state output pins by being able to capture and shift out for inspection the data and control outputs from 3SOB1 and LCB1. Another advantage of allowing the output of LOB1, 3SLOB1 and LCB1 to be captured into Mem1 is that when the IC is initially switched from functional operation into Extest, a capture and shift operation of Mem1 allows the initial test conditions at 2-state and 3-state output pins to be observed.

As described above, the present invention provides: a self initializing and self-correcting boundary scan cell for the data path of 2-state output pins; a self initializing and self-correcting boundary scan cell for the data path of 3-state output pins; a self initializing boundary scan cell for the control path of 3-state output pins; 2-state and 3-state output boundary scan cells with ripple free outputs during capture and shift operations without requiring use of an output hold memory; 2-state and 3-state output boundary scan cells with Mux2 and Mem2 test functions that are transparent while IC is in normal functioning mode; and an output boundary scan design with reduced signal delay for 2-state and 3-state output buffers In the prior art 1149.1 boundary scan design of FIG. 3 it is seen that each 2-state IC output pin requires dedicated test logic for realizing; Mux1, Mem1, Mem2 and Mux2. In the prior art 1149.1 boundary scan design of FIG. 4 it is seen that each 3-state IC output pin, that has its own 3-state control, requires dedicated test logic for realizing; two Mux1s, two Mem1s, two Mem2s, and two Mux2s. In the prior art shared boundary scan design of FIG. 5 it is seen that each 2-state IC output pin requires dedicated test logic for realizing; Mux1, Mem2 and Mux2. In the prior art shared boundary scan design of FIG. 6 it is seen that each 3-state IC output, that has its own 3-state control, requires dedicated test logic for realizing; two Mux1s, two Mem2s and two Mux2s. In the shared boundary scan design of the present invention in FIGS. 7 and 9 it is seen that each 2-state IC output pin requires dedicated test logic for realizing Mux1. In the shared boundary scan design of the present invention in FIGS. 8 and 10 it is seen that each 3-state IC output, that has it own 3-state control, requires dedicated test logic for realizing two Mux1s and an LCB/LCB1. It is important to note that while the LOB/LOB1 and 3SLOB/3SLOB1 include additional circuitry (i.e. the IB and S) not included in the prior art, this additional circuitry is advantageously implemented in the buffer pad region of the IC, and therefore does not consume circuitry in the area of the IC function core logic. The present invention thus provides an output buffer design with the equivalent of prior art Mux2 and Mem2 functions implemented transparently within the output buffer pad region In exemplary FIG. 12, a FOM 121 of the output pin is implemented using the latchable output buffer (LOB) structure of FIGS. 7A-7C, a FIM 123 of the input pin is implemented using a latchable input buffer (LIB) structure analogous to the LOB of FIGS. 7A-7C but utilizing the input buffer 11 of the input pin in combination with a weak feedback buffer, a control FOM 125 of the I/O pin is implemented using a bus holder BH and a switch S of the type shown in FIGS. 7B-7C, an output FOM 127 of the I/O pin is implemented using the 3SLOB structure of FIG. 8A, and a FIM 123 of the I/O pin is implemented using LIB.

Figure 12:
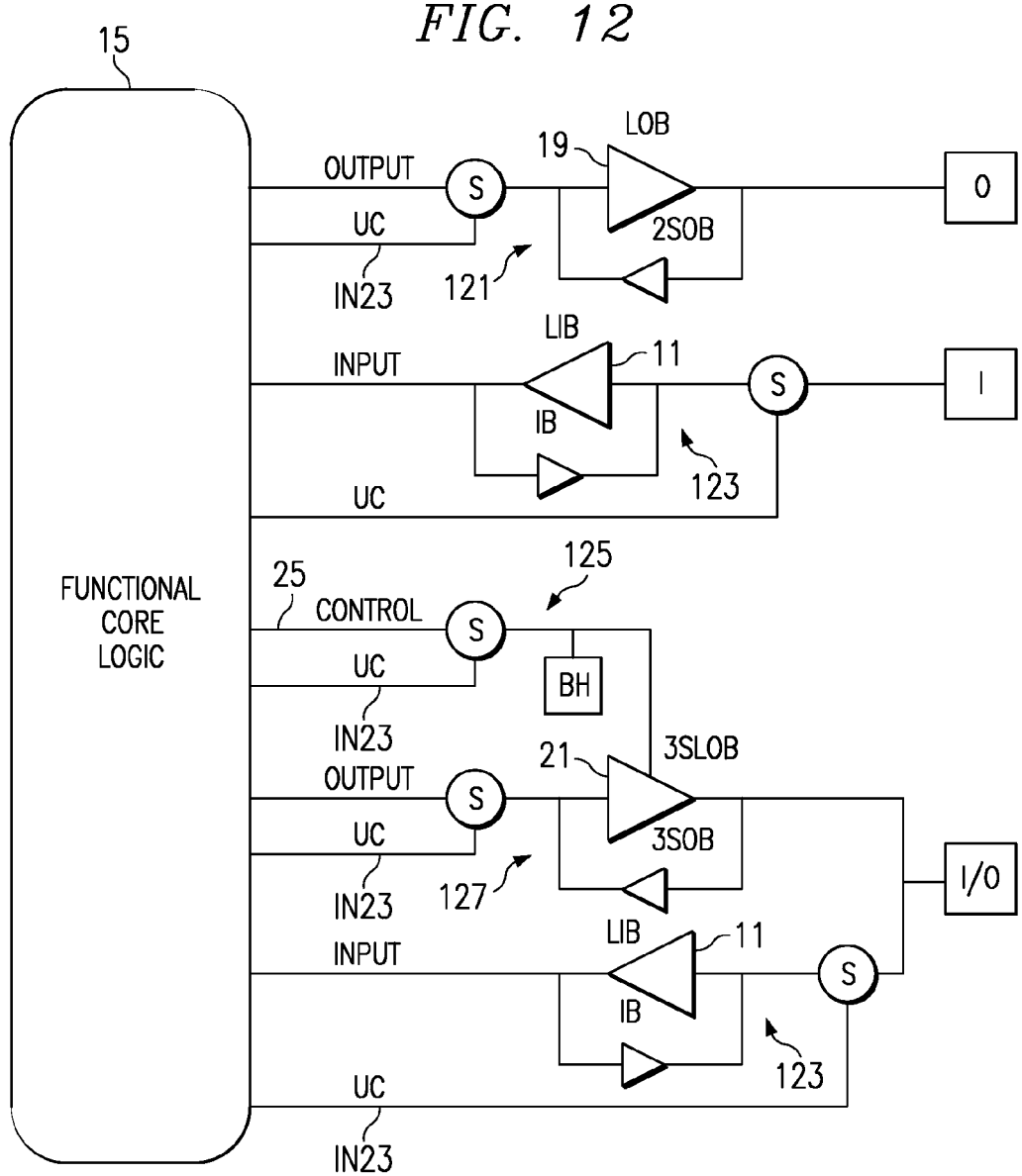
FIGS. 12-12D illustrate various exemplary embodiments of memory designs according to the present invention for use with input, 2-state output, 3-state output and input/output pins.
Figure 12A:
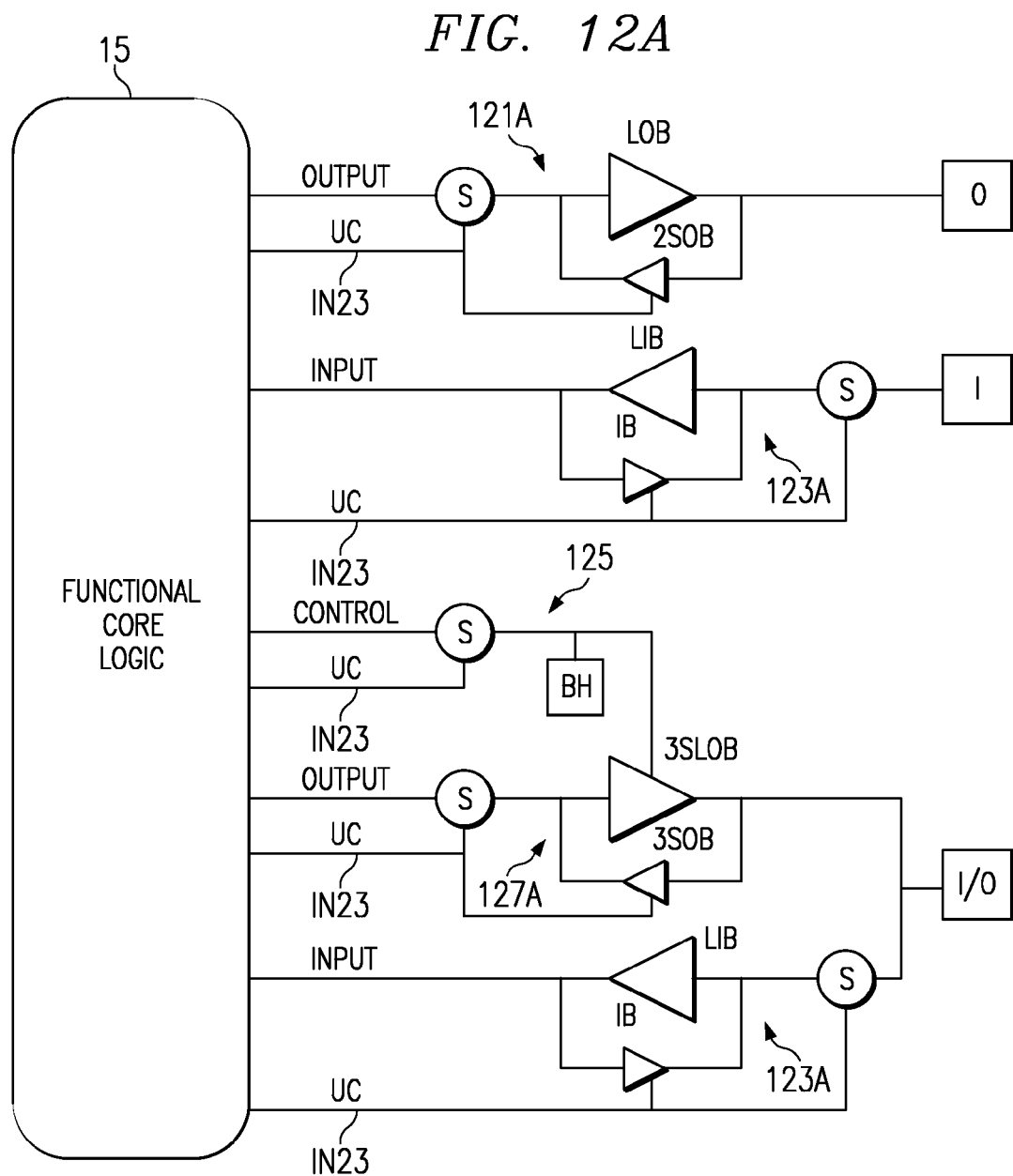
FIG. 12E illustrates the bus holder circuit of FIG. 12.
Figure 12B:
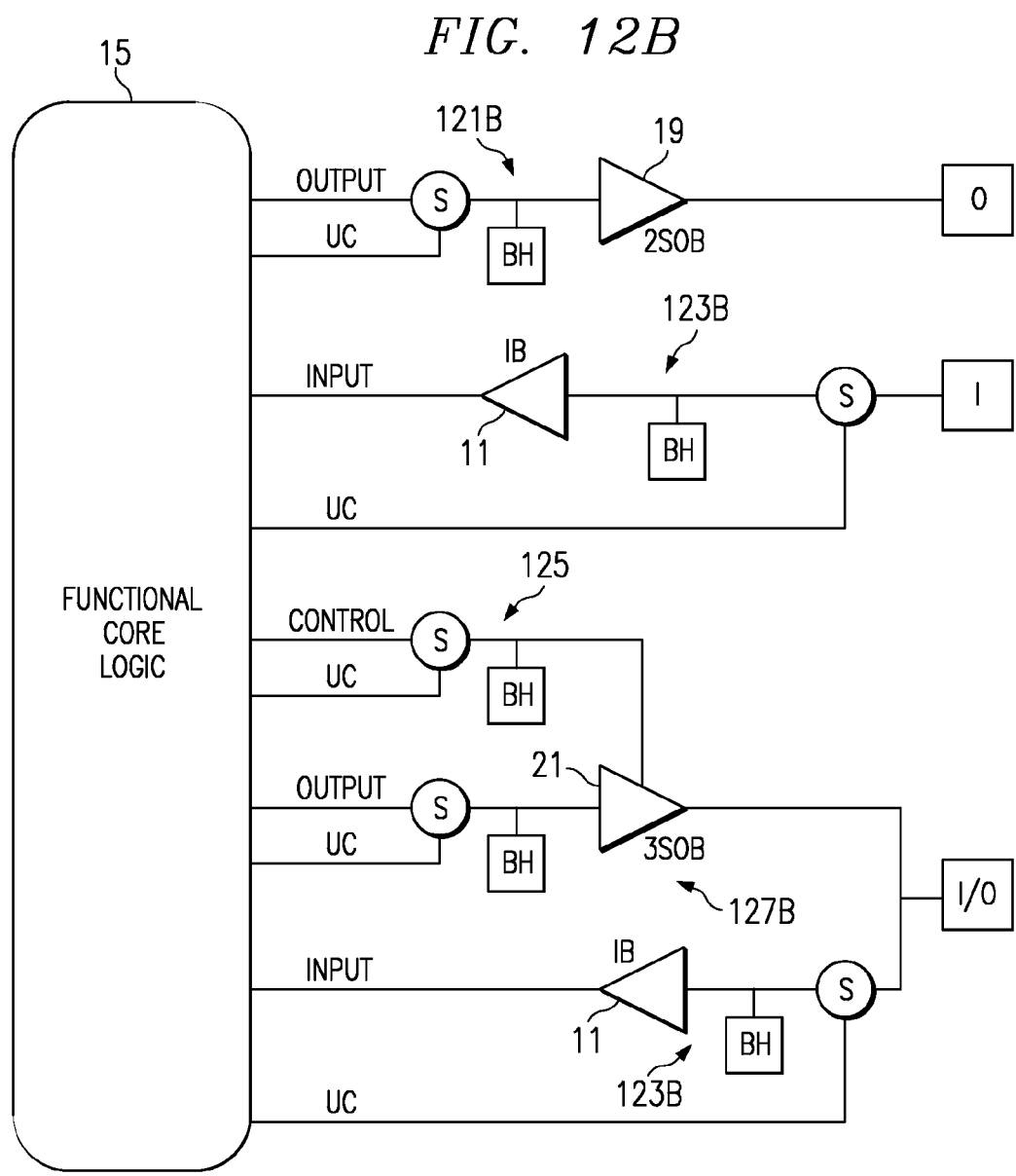
Figure 12C:
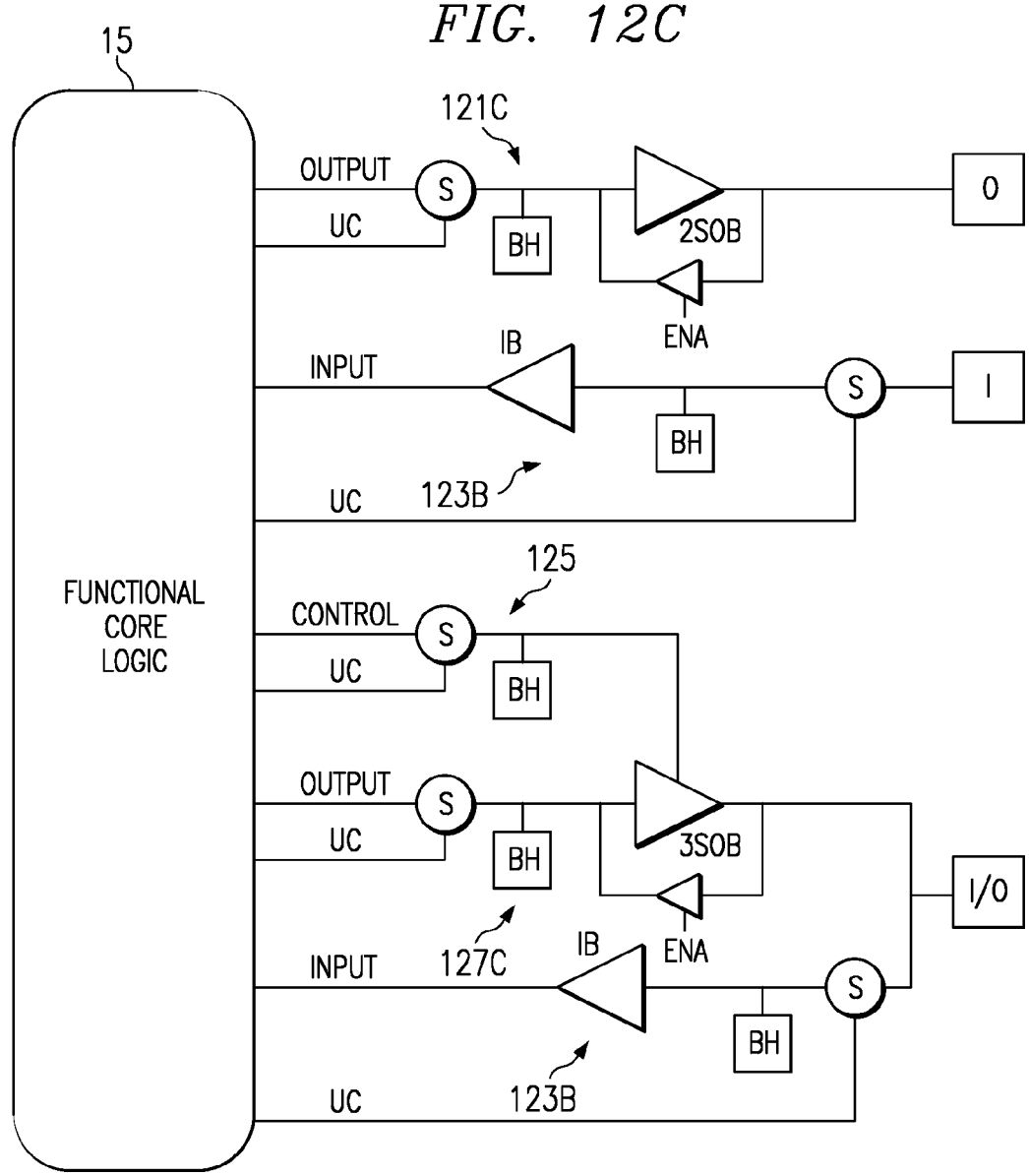
Figure 12D:
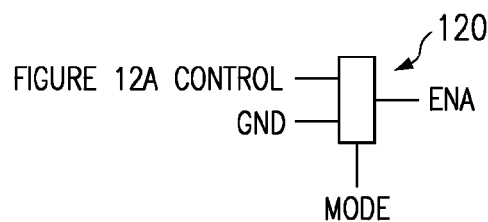
Figure 12E:
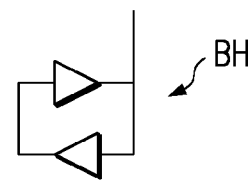

An exemplary bus holder circuit including two cross-coupled internal IC buffers is shown in FIG. 12E.

During functional output operations, the switches S in the control path 25 and in the output paths receive UC (update control) signals from the FCL via control output 23. The UC signals cause the associated switches S to close, which allows the FCL control and output signals to pass through switches S to be input to the LOB and 3SLOB (output signals) and to BH (3-state control signal). Thereafter, the UC signals open the switches S, and the data in the LOB, 3SLOB and BH are maintained. The 3-state control signal at BH is output to the 3SLOB's 3SOB when the associated switch S is first closed and continues to be output to the 3SOB after S is opened. The output signal at the LOB of the output pin is output from the IC when the associated switch S is first closed and continues to be output from the IC after S opens. The output signal at 3SLOB of the I/O pin is output from the IC, if the 3SOB is enabled by the control signal from the BH, when the associated switch S is first closed and continues to be output from the IC after S opens. If the output pin or I/O pin is shorted to or functionally driven by a more powerful opposite voltage level, the LOB/3SLOB will attempt to overdrive the opposing level when S is closed by UC, but will give up to and change state to the opposing level when S is opened by UC. The UC signals can operate together or individually to provide the desired operation.

During functional input operations, the switches S in the input paths receive UC signals from the FCL. The UC signals cause the switches S to close, which allows the input signals to pass through switches S to be input to the LIB. Thereafter, the UC signals open the switches S, and the data in the LIB is maintained. The input signal at each LIB is input to the FCL when the associated switch S is first closed and continues to be input to the FCL after S opens.

In FIG. 12A, the connections between control bus 23 and the respective feedback buffers of the LOB/3SLOB/LIB indicate that these feedback buffers may also be implemented as 3-state buffers (or as transmission gates as shown in FIG. 7B) which are enabled (by UC or a separate signal) when the associated switch S is opened, and are disabled (by UC or a separate signal) when associated switch S is closed. This permits the pins of the IC to be selectively operated as latched pins or as normal non-latched pins, the latter operation being achieved by maintaining the switches S closed and the feedback buffers disabled. If a weak 2-state feedback buffer is used in LOB/3SLOB/LIB (FIG. 12), then the aforementioned non-latched operation is achieved by simply maintaining the associated switch S closed so the FCL 15 can overdrive the weak 2-state feedback buffer.

The FIMs 123 and FOMs 121 and 127 of FIG. 12 and the FIMs 123A and FOMs 121A and 127A of FIG. 12A use the IC's input buffer (in FIMs) and output buffer (in FOMs), thus reducing the amount of circuitry overhead as compared to prior art FIMs and FOMs. The bus holder and switch combination of FOM 125 also uses less circuitry overhead than prior art FOMs.

The signal delay introduced by each FIM and FOM circuit in FIG. 12 is only the delay through S, which is less than in typical prior art FIM/FOMs.

Figure 11:
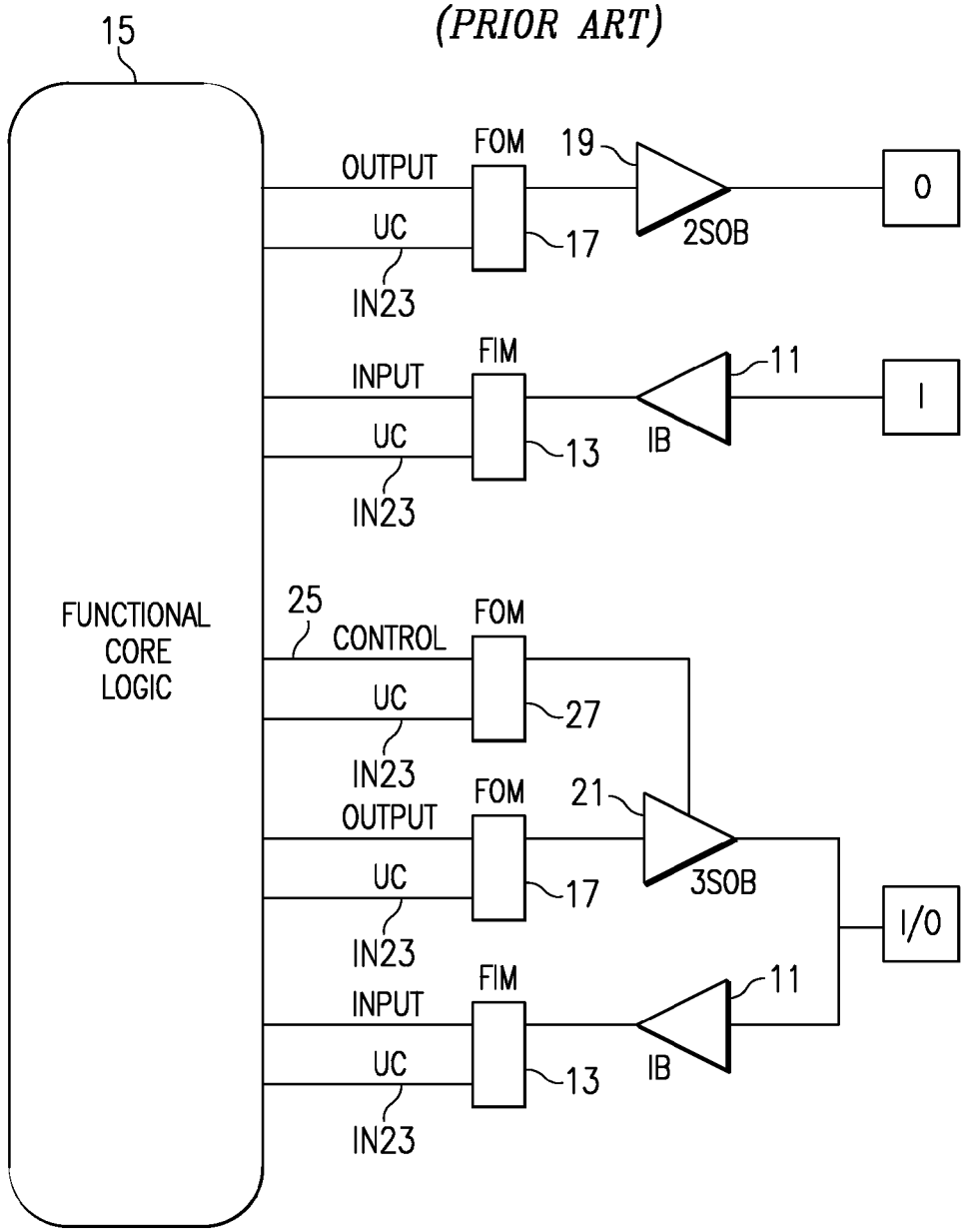
FIG. 11 is similar to FIGS. 1 and 2 but also includes an exemplary input/output pin architecture.

Although the prior art FOMs of FIG. 11 continuously drive the output buffers with latched data even if the output buffers are shorted to an opposing voltage level, the LOB/3SLOB of FIGS. 12 and 12A gives up its drive against opposing voltage levels and changes state to the opposing voltage level after S is opened. Thus better protection of output buffers is provided in FIGS. 12 and 12A. Moreover, when switch S of FOM 121 (121A) is open, an external device (such as another IC) connected to the output pin of FIG. 12 (12A) could use the memory provided by the LOB of FOM 121 (121A) to store data. This is not possible at the output pin of prior art FIG. 11.

It should be noted in FIGS. 12 and 12A that the IC's input buffers 11 drive the FCL 15 directly, thus eliminating any need for the aforementioned high-drive buffers that are often required with prior art FIMs.

Figure 13:
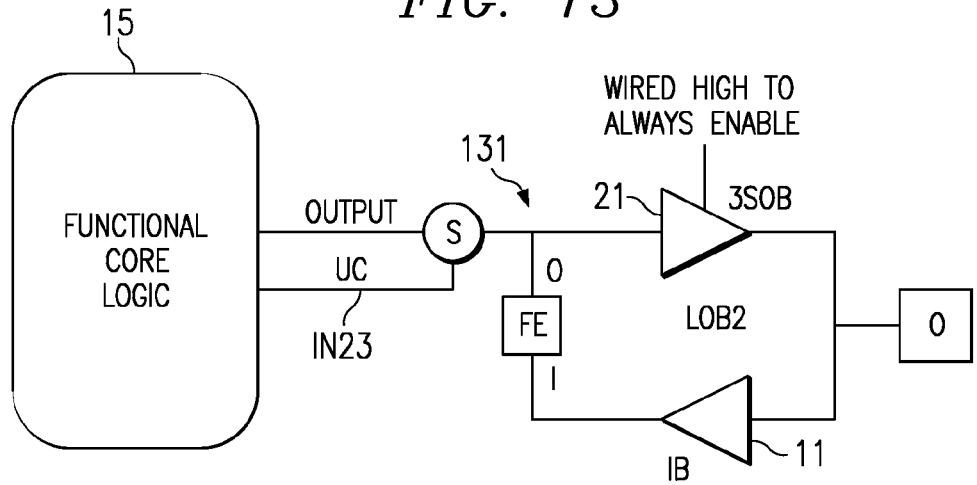
FIGS. 13-13D illustrate exemplary memory designs according to the present invention for use with a 2-state output pin in a user programmable device.
Figure 13A:
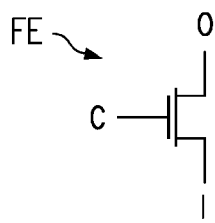
Figure 13B:
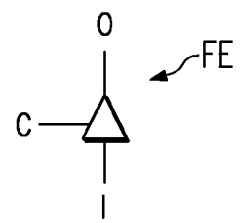
Figure 13C:
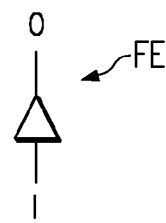

FIG. 13 illustrates another exemplary FOM 131 at a 2-state output pin. The FOM 131 includes a latchable output buffer (LOB2) comprising a 3-state output buffer wired to be a 2-state output buffer, an input buffer 11 that is not connected to drive FCL 15, and a feedback element (FE). This type of implementation may be done on user programmable devices where all pins are designated as I/O types and therefore are provided with an IC input buffer and an IC output buffer as shown in FIG. 13. If it is determined that the pin will operate only as a 2-state output pin, then the unused input buffer 11 can be used as part of the LOB2 as shown. The FE provides feedback to the input of the output buffer from the otherwise unused input buffer. Examples of FE's are shown in FIGS. 13A-13C. As shown, FE can be designed using a transmission gate, a 3-state buffer, or a weak 2-state buffer.

Figure 13D:
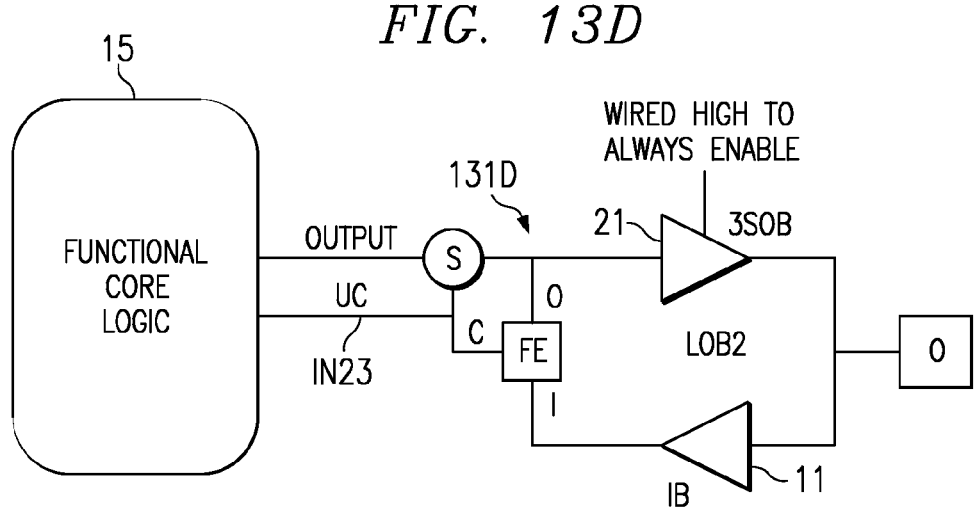

FIG. 13D illustrates another exemplary FOM 131D which is similar to FOM 131. The connection in FIG. 13D between the control bus 23 and FE shows that FE (in the case where FE is a transmission gate or 3-state buffer) can be controlled by UC or a separate signal so that FE is enabled when S is opened, and is disabled when S is closed. This permits the output pin of FIG. 13D to be selectively operated as a latched or non-latched pin, in the same manner described above relative to FIG. 12A. If a weak 2-state buffer is used for FE (FIGS. 13 and 13C), then S is simply maintained closed to permit FCL to overdrive the weak 2-state buffer and provide a non-latched output pin.

Another advantage of using FE and the input buffer 11 to realize LOB2 is that FE is on the FCL side of 3SOB 21 and IB 11 and thus does not adversely affect pin loading (capacitance) or circuitry associated with the pin such as electrostatic discharge (ESD) protection circuitry and voltage level shifting circuitry. In fact, the pin's buffer circuitry need not be modified, but simply connected as shown.

Figure 14:
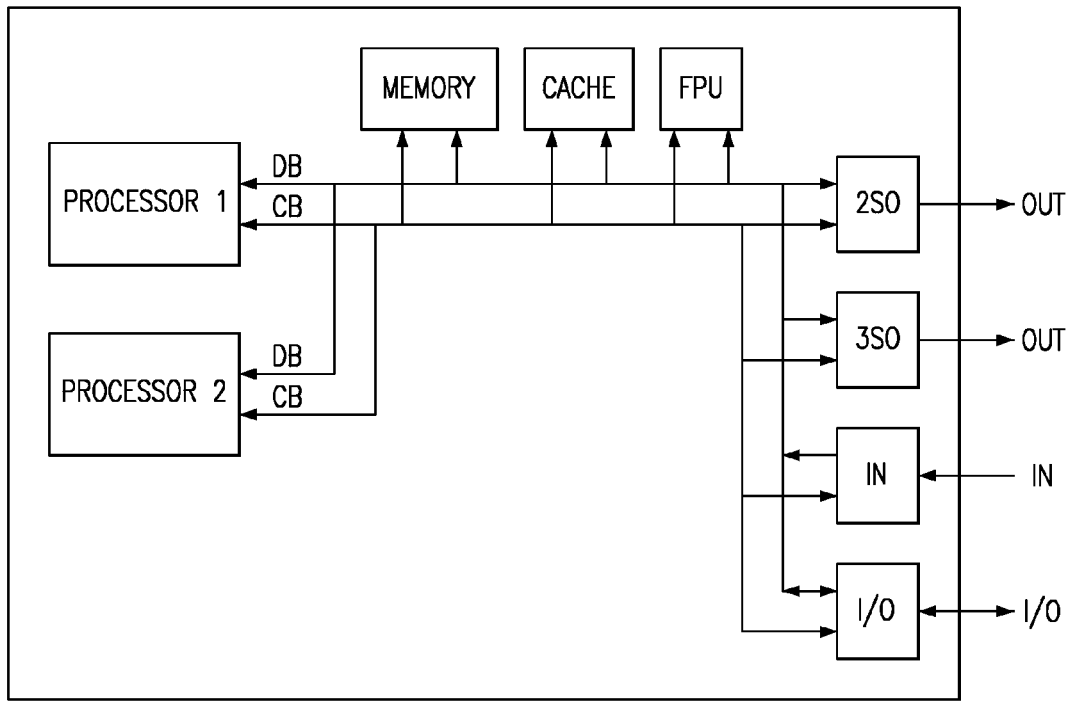
FIG. 14 illustrates an exemplary data processing device according to the present invention.

FIG. 14 illustrates an example IC 141 that uses the LIBs and LOBs as functional memories on 2-state output (2SO), 3-state output (3SO), input (IN), and input/output (I/O) pins. The blocks designated 2SO, 3SO, IN and I/O can include the corresponding FOMs and FIMs from, for example, FIG. 12. The IC 141 is a data processing device comprising processors 1 and 2, memory, cache, and a floating point unit (FPU). During operation the processors communicate with each other using an internal data bus (DB) and an internal control bus (CB). The processors also communicate to the internal memory, cache, and FPU using the DB and CB. The processors also communicate to external devices using DB, CB and the FOMs and FIMs in the 2SO, 3SO, IN and I/O blocks. The CB carries UC signals required to store data in the FOMs and FIMs as shown in FIG. 12, and DB carries the data.

One of the advantages of memoried pins is that the processor device 141 is free to use the internal DB and CB for internal communication while the pin data is latched. In one example, processor 1 may store output data in memoried output pins using the DB and CB, and then, while pin data is stored and output, use the DB and CB to internally communicate with another circuit in the IC. In another example, processor 2 may need to transmit a large number of data words to another device. Using the memoried pins, processor 2 could store at memoried output pins a first data word to be transferred, and then, while the first data word is stored, go fetch the next data word to be transferred, and so on until the last data word is transferred. Without memoried pins, processor 2 would have to hold the data word at the pins using the DB until the word is accepted by the receiving device, then go fetch the next data word.

In another example, processor 1 may be performing an internal communication using the DB and CB when an input occurs at an input pin. The FIMs could receive a free running, periodic UC signal from CB to store the data input so that it is available to processor 1 after the external input goes away. Processor 1, after completing its internal communication, receives the stored input and responds to it. In still another example, processor 2 may store at an output pin(s) data which informs external devices that IC 141 will be unavailable for external communication. While the output pin data is stored, IC 141 may perform extended internal communication. When internal communication is complete, processor 2 indicates that the IC is again ready for external communication by storing data at the output pin(s) to indicate such In general, memoried pins provide input and output signal storage that permits inputting/outputting pin data without interfering with the IC's internal operations.

Another advantage of an architecture with memoried pins is that it provides high speed synchronized communication between ICs. For example, a system could comprise multiple ICs, each IC having memoried pins and each memoried pin being driven by a clock (or UC) common to all memoried pins in the system. This would allow communication between the ICs to occur in a synchronous manner. The data arriving and departing from the memoried pins of each IC is provided storage within the memoried pins. This pin storage allows the internal circuitry of each IC, which typically operates much faster than external communication, time to receive data, process the data, and output data in step with the external synchronous communication flow.

Figure 15:
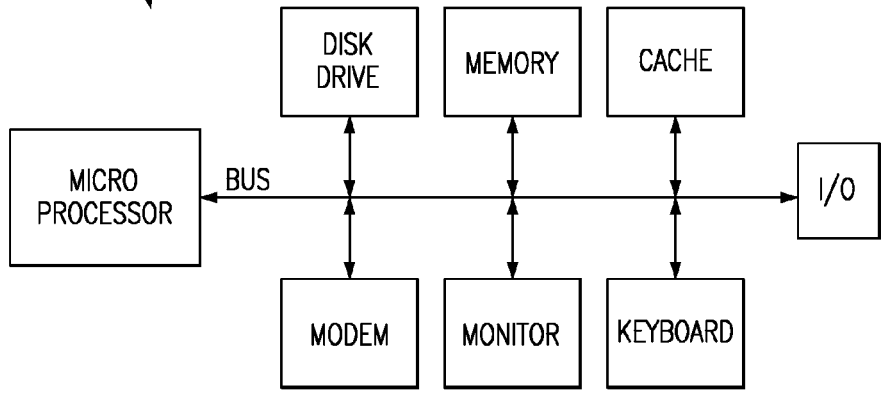
FIG. 15 illustrates an exemplary data processing system according to the present invention.

Exemplary FIG. 15 illustrates a computer system example comprising ICs having memoried pins. The computer system 151 comprises interconnected components including a microprocessor, disk drive, memory, cache, modem, monitor, keyboard, and I/O. The use of memoried pins on the ICs in the various components of the computer system can improve its performance via, for example, the above-described pipelining of pin data transfer during external communication between ICs in the system.

Figure 16:
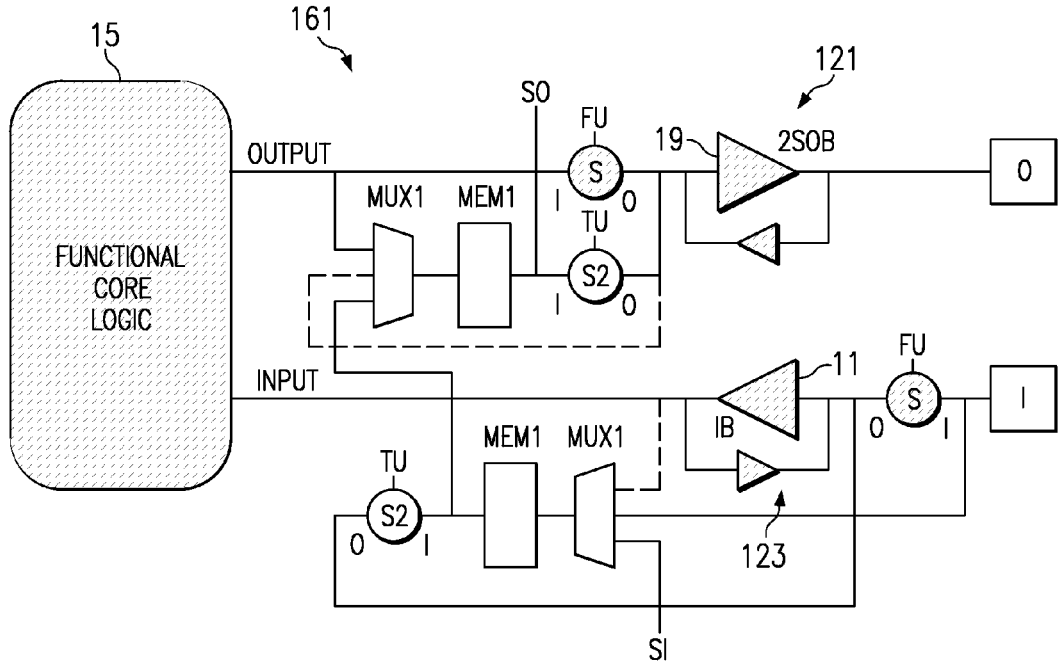
FIGS. 16-16D illustrate various exemplary embodiments of memory designs according to the present invention for use with input and 2-state output pins, and also connected to provide output latching for input and output boundary scan cells.

In exemplary FIG. 16 an IC 161 includes FIM 123 and FOM 121 used as functional pin memories and also connected to provide output latching for input and output boundary scan cells (BSCs). In normal operation, the FIM and FOM provide functional pin memories as in FIG. 12. Circuitry required for functional IC operation is shaded in FIG. 16. The BSC circuitry is non-shaded to indicate test use only. During normal operation of the IC, the S2 switches (which may be the same as switch S) are opened by a test update (TU) signal from control bus 33 (FIG. 3) and the S switches are operated (opened/closed) by a functional update (FU) signal from FCL output 23 (FIG. 12) to store functional data in the FIM and FOM. During test operation of the IC, the S switches are opened by FU and the S2 switches are operated by TU to store test data from Mem1 at the outputs of IB 11 and 2SOB 19.

The boundary scan circuitry (dedicated test circuitry shown non-shaded) in FIG. 16 consists of only Mux1, Mem1, and S2 for both input and output pin. Comparing the signal paths between FCL and the pins of FIG. 16 to the corresponding signal paths in FIG. 12, it is clear that the boundary scan implementation of FIG. 16 adds no delay to the input or output signal path. Thus, boundary scan operation is achieved with no speed penalty to the functional signal paths. The boundary scan implementations of FIGS. 3-10 disadvantageously introduce delays into the input and output signal paths of FIGS. 1-2. Switches S2 in FIG. 16 permit the scan path from SI to SO to be isolated from FIM 123 and FOM 121, thus permitting scan operations to be performed whenever desired during functional or test operation of IC 161.

Figure 16A:
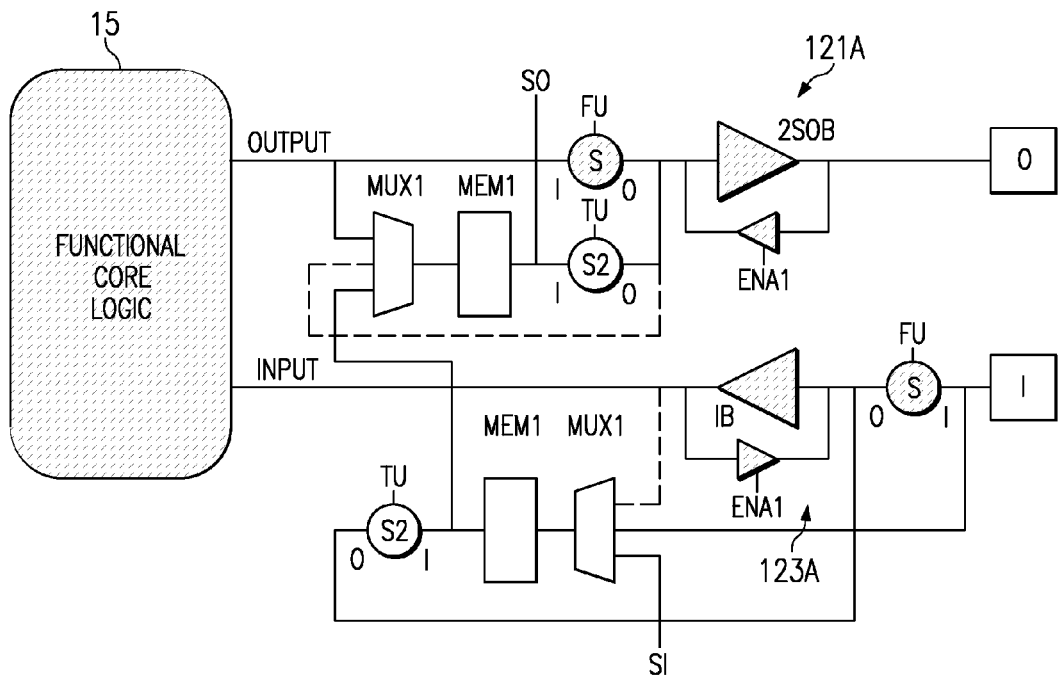

The ENA1 input to the feedback buffers of FOM 121A and FIM 123A in FIG. 16A indicates that the feedback buffers may be implemented as 3-state buffers as in FIGS. 12A and 13D. The ENA1 signal may be a logical OR of the FU and TU signals, or may be a separate signal.

Figure 17D:
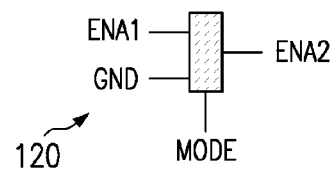
FIGS. 17-17D provide exemplary illustrations of how the features of FIGS. 16-16D can be applied to input/output pins.
Figure 17:
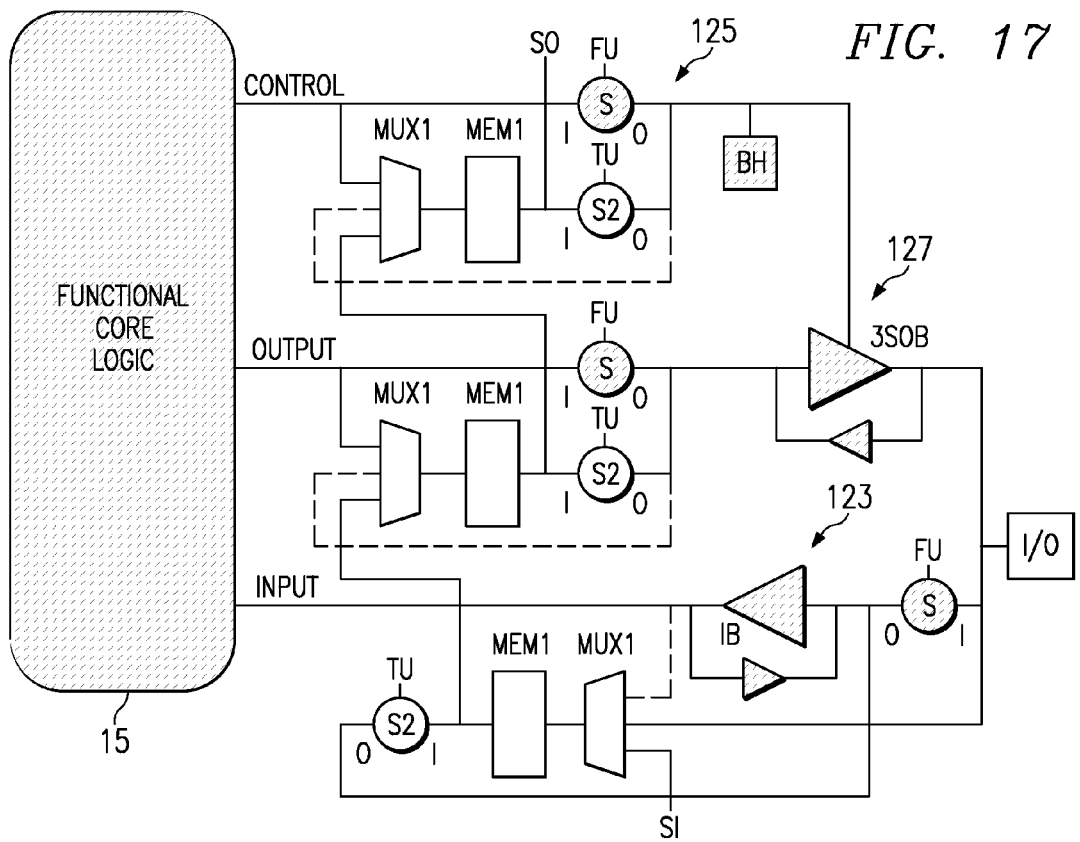

In FIG. 17, an exemplary input/output pin is shown using functionally required (shaded) FIM 123 and FOMs 127 and 125 as in FIG. 12. The boundary scan circuitry is shown non-shaded and consists of only S2, Mux1 and Mem1 for each signal path (control, output, input). Again, as in FIG. 16 switches S2 can isolate the scan path from the FIMs and FOMs, and the circuitry for boundary scan adds no delay to the corresponding signal paths of FIG. 12. A boundary scan example for a 3-state output pin is clearly seen in FIG. 17 by eliminating the input signal path from pin to FCL, and the associated BSC.

Figure 17A:
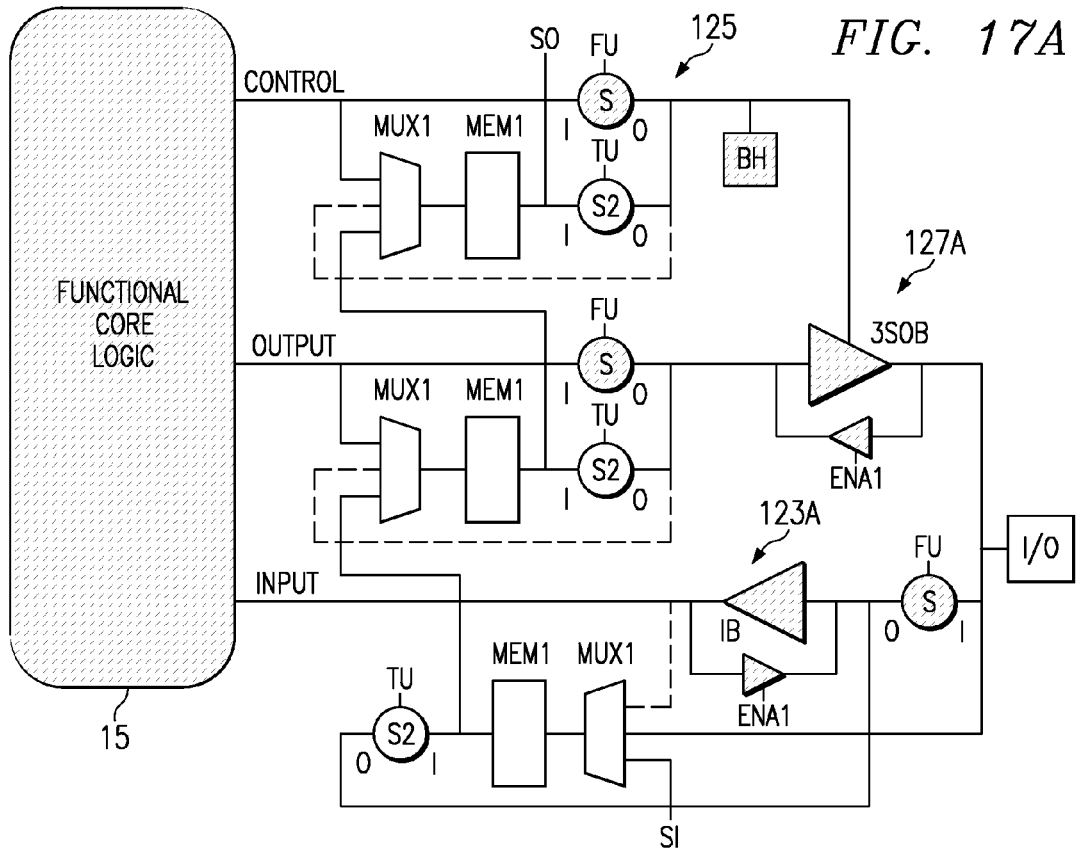

The ENA1 signal in FIG. 17A is the same as discussed above relative to FIG. 16A.

The broken line connections shown in FIGS. 16-17 provide feedback paths that permit data previously latched into the FIM/FOM structures to be captured into the Mem1s and shifted out through the scan path for evaluation. This permits, for example, the BSCs to perform self-testing.

In some systems it may be desirable to provide a memoried pin capability that is highly resistant to electrical noise produced by the system or by the environment in which the system resides. Such noise can be produced from large systems operating at high speeds, inadequate power supply capacity, filtering, or isolation, or poorly terminated signal transmission lines. Electrical noise can occur internal to the IC or external to the IC. While providing hysteresis and/or other known noise immunity circuitry on the feedback buffers of FIGS. 12 and 12A can protect against inadvertent pin state changes in normal system environments, severely noisy system environments might possibly cause a pin state change to occur due to the use of feedback buffers.

In FIG. 12B an alternate memoried pin implementation example is shown. FOM 121B, FOM 127B, and FIMs 123B in FIG. 12B are realized by placing a BH between S and the input or output buffer. On IC outputs, the FCL outputs UC to momentarily close S. When S is closed, the data value from the FCL drives the output pin via the output buffer, and when S is opened the driven output data value is maintained by operation of the BH. On IC inputs, the FCL outputs UC to momentarily close S. When S is closed, the data value from the input pin drives the FCL via the input buffer, and when S is opened the driven input data value is maintained by the BH. Since only the BH is used to maintain data, no feedback exists between output and input of the pin buffers 11, 19 and 21, so the data driven by the pin buffers is tolerant to high levels of internal or external noise present on the output of the pin buffers.

Exemplary FIG. 12C shows FOMs 121C and 127C using both the BH (FIG. 12B) and 3-state feedback buffer (FIG. 12A) memory techniques on IC output pins. The BH and 3-state feedback buffer provide two distinct modes of IC output pin memory operation. One mode is referred to as development mode and the other is referred to as mission mode. The development mode is where the system hardware and software are being integrated together and tasks like software code debug, system emulation and testing take place. During development mode, system resident ICs may be at risk of output buffer damage due to assembly faults (e.g. short pins), or hardware/software design errors that can cause IC pins to be placed in contention with one another. Therefore during development mode, it is beneficial to provide output buffers with the safe operation mode provided by the 3-state feedback buffer. With the 3-state feedback buffer enabled (by signal ENA), the state of the BH can be overdriven by the feedback buffer (which must be strong enough to overdrive BH) to eliminate contention at the output pins. That is, the IC of FIG. 12C operates generally the same as the IC of FIG. 12A. Thus output pin contention situations are resolved in a safe way that avoids damage to or destruction of expensive ICs and/or circuit boards during the development mode.

After the development mode is completed and the system is stable and operates as expected, the IC can be placed in its mission mode. In mission mode, the feedback buffer can be disabled (by ENA) to prevent the possibility of pin memory state change in response to severely noisy system environments, whereby the IC of FIG. 12C operates as described in regard to the IC of FIG. 12B. FIG. 12D shows an example multiplexing circuit 120 that selectively causes the IC of FIG. 12C to operate in either the development or mission mode. In development mode, the multiplexer couples the FIG. 12A control, previously described, to ENA to enable the feedback buffer and provide the safe output buffer operation of FIG. 12A. In mission mode, the multiplexer couples ground (GND) to ENA to disable the feedback buffer and provide the high noise immunity operation of the memoried pins described previously in regard to FIG. 12B. Of course, either development or mission mode can be selected as desired at any stage of the system's life, from initial development to actual deployment. The mode signal, input to the multiplexer for selecting development or mission modes, can come from an IC pin or a register within the IC.

Figure 16B:
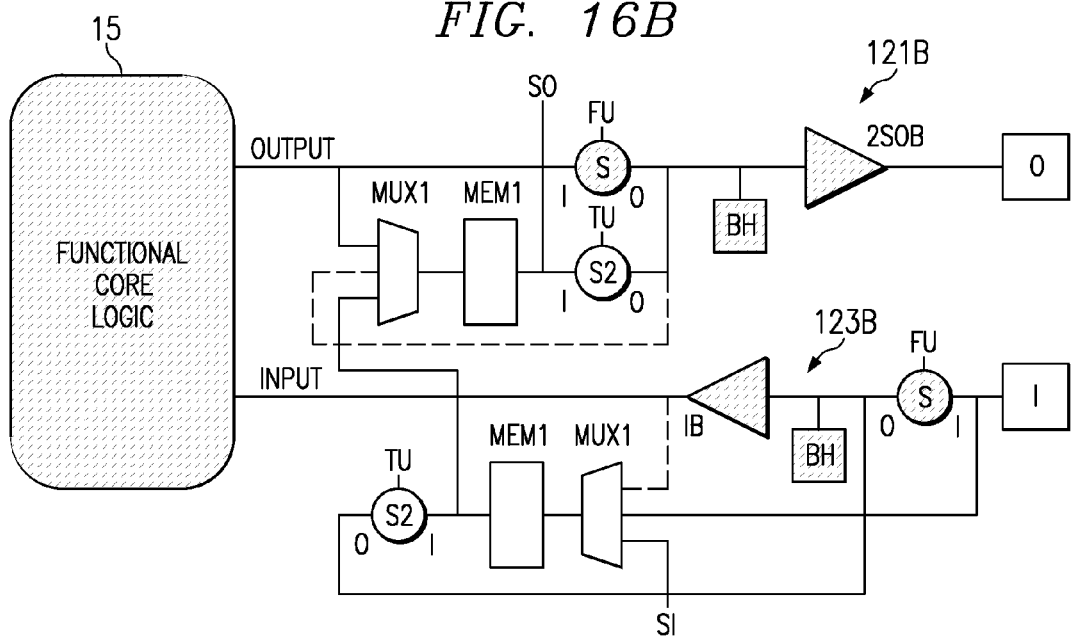

Exemplary FIG. 16B is similar to FIGS. 16 and 16A, but the FOM 121B and FIM 123B use bus holders BH instead of the feedback buffers used in the FOMs and FIMs of FIGS. 16 and 16A. The advantage of using BH's for memoried pins was described in regard to FIG. 12B.

Figure 16C:
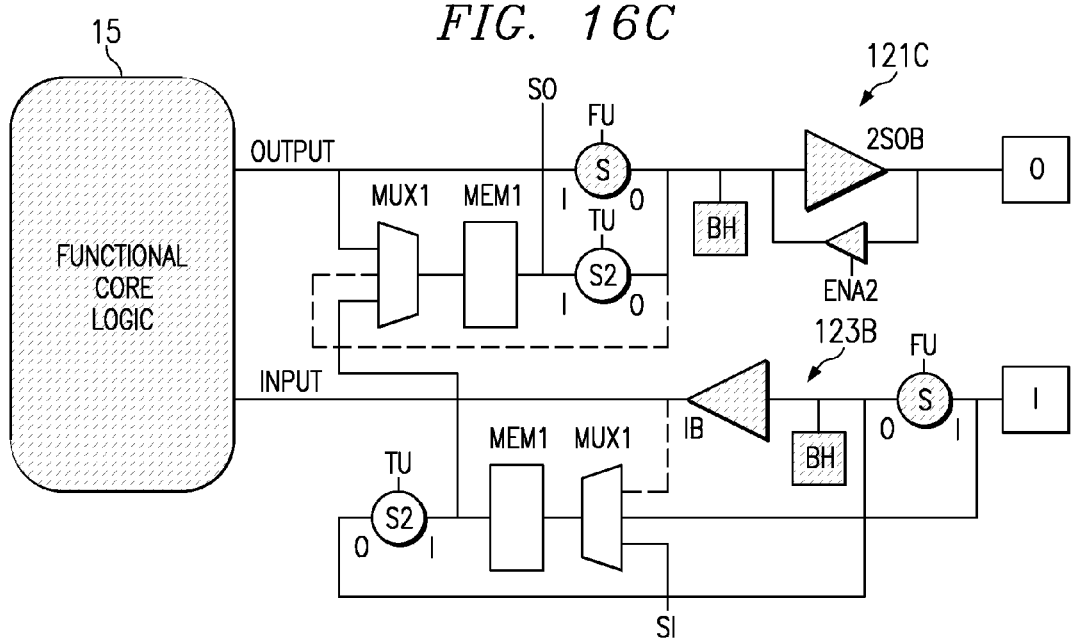
Figure 16D:
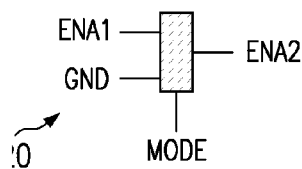

Exemplary FIG. 16C is similar to FIGS. 16-16B but illustrates the use of both BH (FIG. 16B) and a 3-state feedback buffer (FIG. 16A) in FOM 121C, similarly to FIG. 12C. During boundary scan testing the FOM 121C can be controlled by signal ENA2 to enable the feedback buffer and thereby allow the safe boundary scan test previously described in regard to FIG. 16. As shown in FIG. 16D, a multiplexer circuit 120 can selectively connect ENA2 to ENA1 (FIG. 16A) or GND, depending on whether development (ENA1) or mission (GND) mode is selected. When enabled by ENA2, the feedback buffer can overdrive the state of the BH to eliminate output buffer contention. Exemplary benefits of the example in FIG. 16C are; (1) the high pin memory noise immunity of FIG. 16B, (2) the selectivity between development and mission modes similar to FIG. 12C, and (3) the safe, shared resource boundary scan testing of FIG. 16. Of course, either mission or development mode may be selected for boundary scan testing, which testing may be done at any stage of the IC's life, for example, during IC production or system development, or after the IC has been deployed as part of a system in the actual system environment.

Figure 17B:
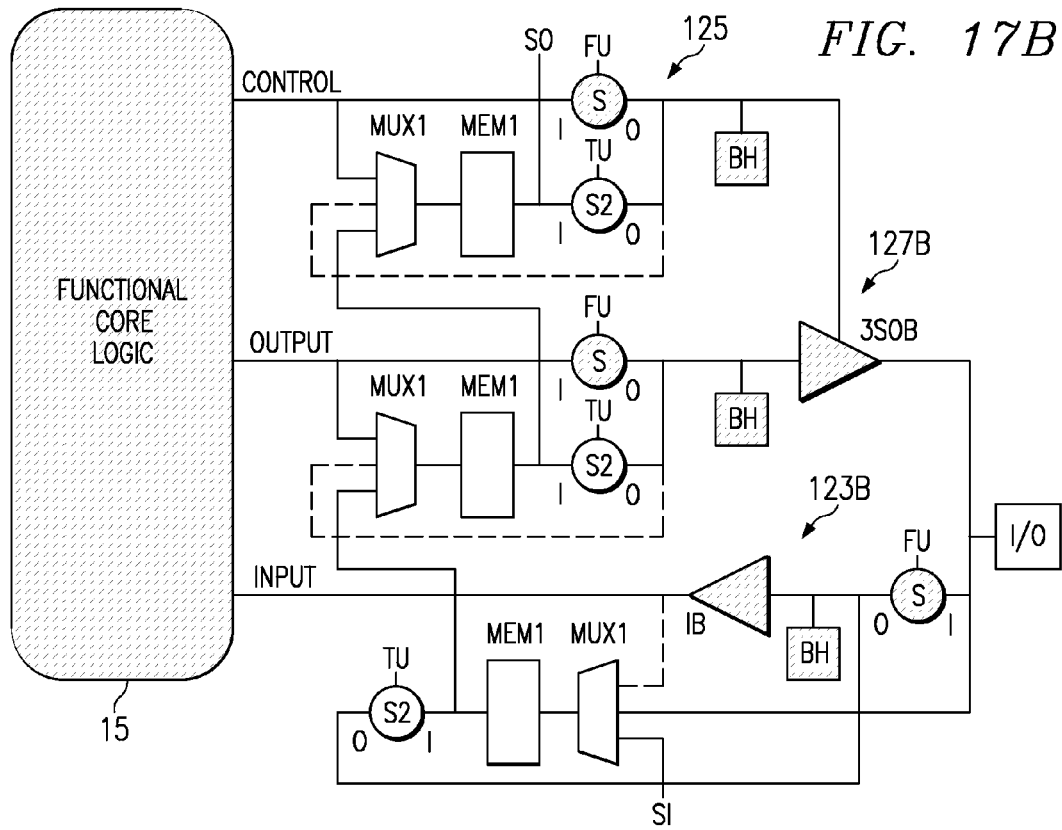
Figure 17C:
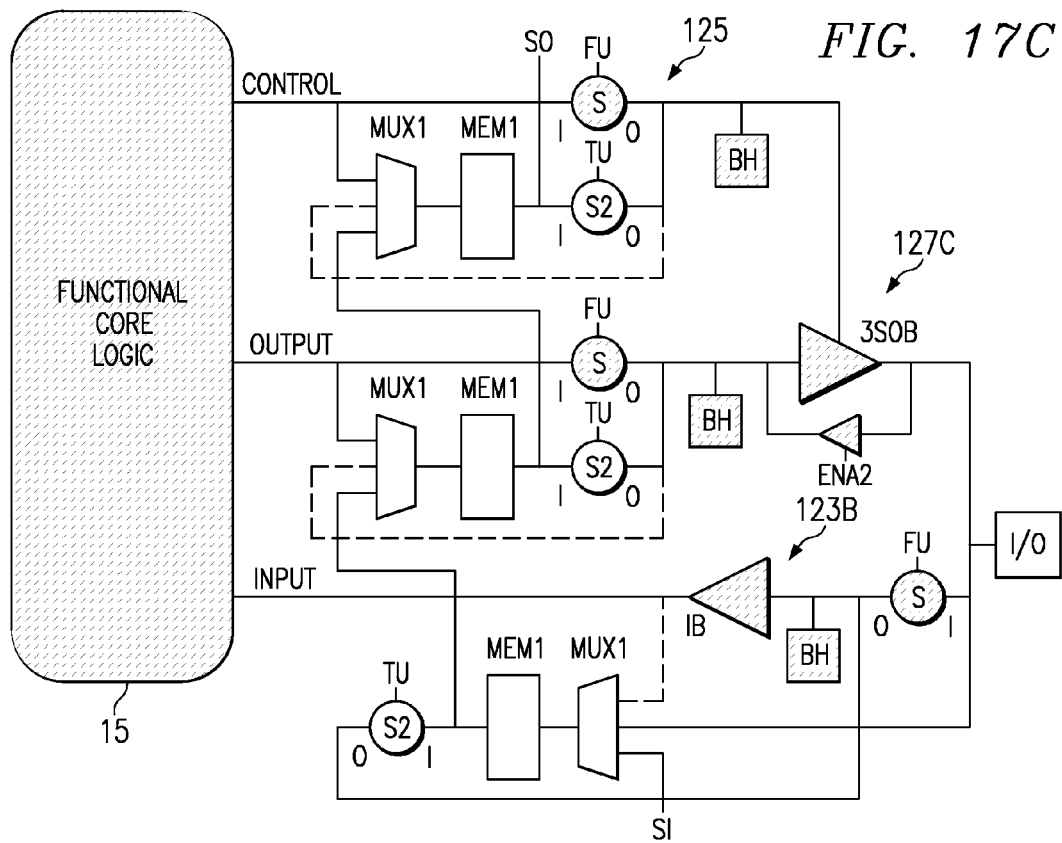

Exemplary FIGS. 17B-17D illustrate the techniques of FIGS. 12B-12D and 16B-16D as applied to an I/O pin architecture of the type shown in FIGS. 17 and 17A.

Although exemplary embodiments of the present invention are described above, this description does not limit the scope of the invention, which can be practiced in a variety of embodiments.

What is claimed is:
1. An integrated circuit comprising:
A. functional logic having a functional output lead and a control output lead;
B. a three state output buffer coupled between the functional output lead and an output lead and having a control input;
C. a serial in data lead;
D. a multiplexer having an output, a first input coupled to the functional output lead and a second input coupled to the serial in data lead;

E. a memory circuit having an input coupled to the output of the multiplexer and having an output;

F. a serial out data lead coupled to the output of the memory circuit; and

G. a latching control buffer having an input coupled to the control output lead of the functional logic, a control input, and an output coupled to the control input of the three state output buffer.

2. The integrated circuit of claim 1 in which the latching control buffer includes a switch circuit having a control lead coupled to the control input.

3. The integrated circuit of claim 1 in which the latching control buffer includes a switch circuit having an input coupled to the control output lead of the functional logic, a control lead coupled to the control input, and a switch output, and including an output buffer circuit coupled between the switch output and the output of the latching control buffer, and including an input buffer coupled between the switch circuit output and the output of the latching control buffer.

4. The integrated circuit of claim 1 in which the latching control buffer includes a switch circuit having an input coupled to the control output lead of the functional logic, a control lead coupled to the control input, and a switch output, and including an output buffer circuit coupled between the switch output and the output of the latching control buffer, and including an input buffer coupled between the switch circuit output and the output of the latching control buffer, the input buffer being weaker than the output buffer circuit.

* * * * *